United States Patent
Lehnert et al.

(10) Patent No.: US 12,256,200 B2
(45) Date of Patent: *Mar. 18, 2025

(54) THERMAL CONTROL OF AUDIO PLAYBACK DEVICES

(71) Applicant: Sonos, Inc., Santa Barbara, CA (US)

(72) Inventors: Hilmar Lehnert, Framington, MA (US); Aurelio Ramos, Jamaica Plain, MA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/479,606

(22) Filed: Oct. 2, 2023

(65) Prior Publication Data

US 2024/0031750 A1 Jan. 25, 2024

Related U.S. Application Data

(63) Continuation of application No. 17/938,513, filed on Oct. 6, 2022, now Pat. No. 11,792,589, which is a
(Continued)

(51) Int. Cl.
*H04R 29/00* (2006.01)
*G01K 1/14* (2021.01)
(Continued)

(52) U.S. Cl.
CPC ............. *H04R 29/001* (2013.01); *G01K 1/14* (2013.01); *G01K 3/10* (2013.01); *H03G 3/3005* (2013.01);
(Continued)

(58) Field of Classification Search
CPC .............. H04R 29/001; H04R 3/007; H04R 2227/005; H04R 29/007; G01K 1/14;
(Continued)

(56) References Cited

U.S. PATENT DOCUMENTS 5,440,644 A 8/1995 Farinelli et al.
5,761,320 A 6/1998 Farinelli et al.
(Continued)

FOREIGN PATENT DOCUMENTS

EP 1389853 A1 2/2004
EP 3408936 A2 12/2018
(Continued)

OTHER PUBLICATIONS

AudioTron Quick Start Guide, Version 1.0, Mar. 2001, 24 pages.
(Continued)

*Primary Examiner* — Xu Mei
(74) *Attorney, Agent, or Firm* — Fortem IP LLP

(57) ABSTRACT

To avoid damage from overheating, playback device operation can be modulated based on input from temperature sensors. An example method includes obtaining, via one or more temperature sensors carried by the playback device, temperature data. Based on the temperature data, a first temperature parameter is detected. In response to detecting the first temperature parameter, a gain of audio playback is decreased by a first amount. After decreasing the gain of audio playback by the first amount, a second temperature parameter is detected. In response to detecting the second temperature parameter, the gain of audio playback is decreased by a second amount different than the first amount.

20 Claims, 10 Drawing Sheets

Related U.S. Application Data continuation of application No. 17/301,012, filed on Mar. 22, 2021, now Pat. No. 11,496,848.

(60) Provisional application No. 62/994,720, filed on Mar. 25, 2020.

(51) Int. Cl.
| | | |
|---|---|---|
| *G01K 3/10* | (2006.01) | |
| *H03G 3/30* | (2006.01) | |
| *H04R 3/00* | (2006.01) | |

(52) U.S. Cl.
CPC ....... *H04R 3/007* (2013.01); *H03G 2201/708* (2013.01)

(58) Field of Classification Search
CPC .. G01K 3/10; H03G 3/3005; H03G 2201/708; H04N 21/42202; H04N 21/4398; H04N 21/4424
USPC .............................................. 381/55, 59, 96
See application file for complete search history.

(56) References Cited

U.S. PATENT DOCUMENTS

| | | | |
|---|---|---|---|
| 5,923,902 | A | 7/1999 | Inagaki |
| 6,032,202 | A | 2/2000 | Lea et al. |
| 6,256,554 | B1 | 7/2001 | DiLorenzo |
| 6,404,811 | B1 | 6/2002 | Cvetko et al. |
| 6,469,633 | B1 | 10/2002 | Wachter |
| 6,494,381 | B2 * | 12/2002 | Bulthuis ................ G06F 1/206 181/141 |
| 6,522,886 | B1 | 2/2003 | Youngs et al. |
| 6,611,537 | B1 | 8/2003 | Edens et al. |
| 6,631,410 | B1 | 10/2003 | Kowalski et al. |
| 6,757,517 | B2 | 6/2004 | Chang |
| 6,778,869 | B2 | 8/2004 | Champion |
| 7,130,608 | B2 | 10/2006 | Hollstrom et al. |
| 7,130,616 | B2 | 10/2006 | Janik |
| 7,143,939 | B2 | 12/2006 | Henzerling |
| 7,236,773 | B2 | 6/2007 | Thomas |
| 7,295,548 | B2 | 11/2007 | Blank et al. |
| 7,391,791 | B2 | 6/2008 | Balassanian et al. |
| 7,483,538 | B2 | 1/2009 | McCarty et al. |
| 7,571,014 | B1 | 8/2009 | Lambourne et al. |
| 7,630,501 | B2 | 12/2009 | Blank et al. |
| 7,643,894 | B2 | 1/2010 | Braithwaite et al. |
| 7,657,910 | B1 | 2/2010 | McAulay et al. |
| 7,853,341 | B2 | 12/2010 | McCarty et al. |
| 7,987,294 | B2 | 7/2011 | Bryce et al. |
| 8,014,423 | B2 | 9/2011 | Thaler et al. |
| 8,045,952 | B2 | 10/2011 | Qureshey et al. |
| 8,103,009 | B2 | 1/2012 | McCarty et al. |
| 8,234,395 | B2 | 7/2012 | Millington |
| 8,483,853 | B1 | 7/2013 | Lambourne |
| 8,942,252 | B2 | 1/2015 | Balassanian et al. |
| 9,729,986 | B2 | 8/2017 | Crawley et al. |
| 10,200,000 | B2 | 2/2019 | Cheng et al. |
| 11,496,848 | B2 * | 11/2022 | Lehnert ................ H04R 29/007 |
| 11,792,589 | B2 * | 10/2023 | Lehnert ................ H04R 3/007 381/59 |
| 2001/0042107 | A1 | 11/2001 | Palm |
| 2002/0022453 | A1 | 2/2002 | Balog et al. |
| 2002/0026442 | A1 | 2/2002 | Lipscomb et al. |
| 2002/0124097 | A1 | 9/2002 | Isely et al. |
| 2003/0157951 | A1 | 8/2003 | Hasty, Jr. |
| 2004/0024478 | A1 | 2/2004 | Hans et al. |
| 2007/0142944 | A1 | 6/2007 | Goldberg et al. |
| 2013/0077796 | A1 | 3/2013 | Risbo et al. |
| 2013/0113558 | A1 | 5/2013 | Pfaffinger et al. |
| 2015/0085441 | A1 | 3/2015 | Reilly et al. |
| 2018/0213322 | A1 | 7/2018 | Napoli et al. |
| 2019/0045301 | A1 | 2/2019 | Family et al. |
| 2020/0028474 | A1 | 1/2020 | Chiu et al. |
| 2020/0217724 | A1 * | 7/2020 | Golubovic .......... H01M 50/581 |

FOREIGN PATENT DOCUMENTS

| | | | |
|---|---|---|---|
| EP | 3413463 | A1 | 12/2018 |
| WO | 200153994 | | 7/2001 |
| WO | 2003093950 | A2 | 11/2003 |

OTHER PUBLICATIONS

AudioTron Reference Manual, Version 3.0, May 2002, 70 pages.
AudioTron Setup Guide, Version 3.0, May 2002, 38 pages.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
International Bureau, International Preliminary Report on Patentability, mailed on Oct. 6, 2022, issued in connection with International Application No. PCT/US2021/070297, filed on Mar. 22, 2021, 7 pages.
International Bureau, International Search Report and Written Opinion mailed on Jun. 7, 2021, issued in connection with International Application No. PCT/US2021/070297, filed on Mar. 22, 2021, 12 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 http://www.reviewsonline.com/articles/961906864.htm retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Non-Final Office Action mailed on Mar. 16, 2023, issued in connection with U.S. Appl. No. 17/938,513, filed Oct. 6, 2022, 12 pages.
Non-Final Office Action mailed on Mar. 17, 2022, issued in connection with U.S. Appl. No. 17/301,012, filed Mar. 22, 2021, 7 pages.
Notice of Allowance mailed on Jul. 5, 2022, issued in connection with U.S. Appl. No. 17/301,012, filed Mar. 22, 2021, 7 pages.
Notice of Allowance mailed on Jul. 11, 2023, issued in connection with U.S. Appl. No. 17/938,513, filed Oct. 6, 2022, 7 pages.
Palm, Inc., "Handbook for the Palm VII Handheld," May 2000, 311 pages.
Presentations at WinHEC 2000, May 2000, 138 pages.
United States Patent and Trademark Office, U.S. Appl. No. 60/490,768, filed Jul. 28, 2003, entitled "Method for synchronizing audio playback between multiple networked devices," 13 pages.
United States Patent and Trademark Office, U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.

* cited by examiner

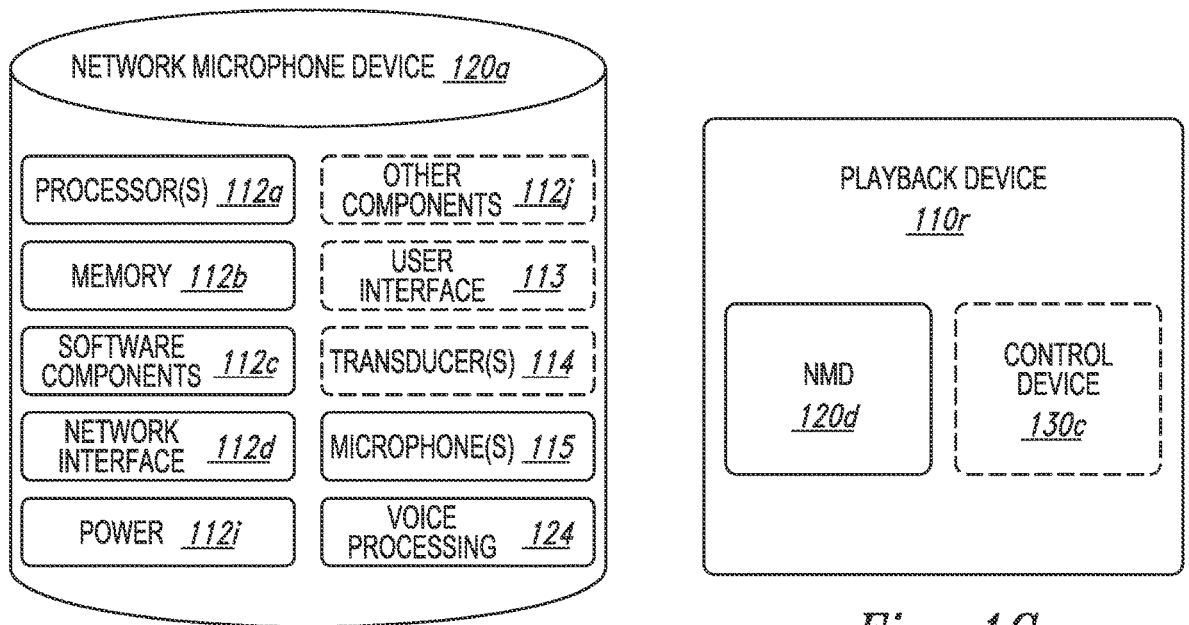
Fig. 1F
Fig. 1G
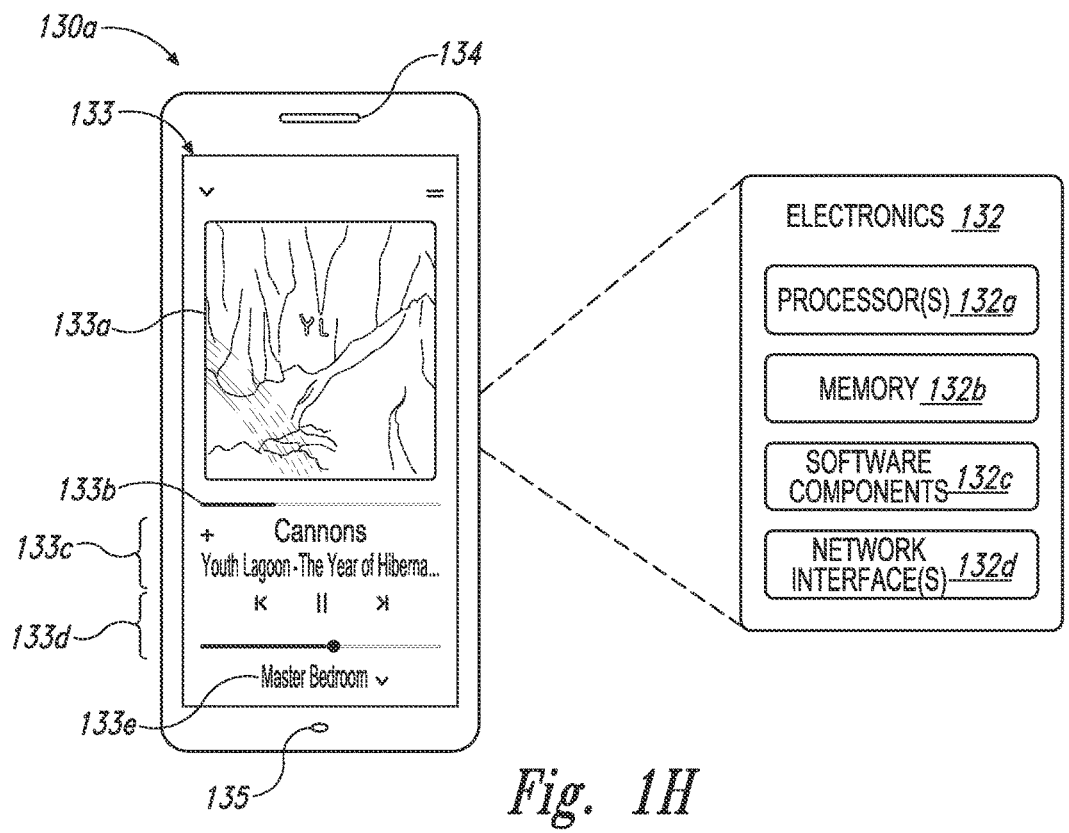
Fig. 1H

THERMAL CONTROL OF AUDIO PLAYBACK DEVICES

CROSS-REFERENCE TO RELATED APPLICATIONS

The present application is a continuation of U.S. patent application Ser. No. 17/938,513, filed Oct. 6, 2022, now U.S. Pat. No. 11,792,589, which is a continuation of U.S. patent application Ser. No. 17/301,012, filed Mar. 22, 2021, now U.S. Pat. No. 11,496,848, which claims the benefit of priority to U.S. Patent Application No. 62/994,720, filed Mar. 25, 2020, each of which is incorporated herein by reference in its entirety.

FIELD OF THE DISCLOSURE

The present disclosure is related to consumer goods and, more particularly, to methods, systems, products, features, services, and other elements directed to media playback or some aspect thereof.

BACKGROUND

Options for accessing and listening to digital audio in an out-loud setting were limited until in 2002, when SONOS, Inc. began development of a new type of playback system. Sonos then filed one of its first patent applications in 2003, entitled "Method for Synchronizing Audio Playback between Multiple Networked Devices," and began offering its first media playback systems for sale in 2005. The Sonos Wireless Home Sound System enables people to experience music from many sources via one or more networked playback devices. Through a software control application installed on a controller (e.g., smartphone, tablet, computer, voice input device), one can play what she wants in any room having a networked playback device. Media content (e.g., songs, podcasts, video sound) can be streamed to playback devices such that each room with a playback device can play back corresponding different media content. In addition, rooms can be grouped together for synchronous playback of the same media content, and/or the same media content can be heard in all rooms synchronously.

BRIEF DESCRIPTION OF THE DRAWINGS

Features, examples, and advantages of the presently disclosed technology may be better understood with regard to the following description, appended claims, and accompanying drawings, as listed below. A person skilled in the relevant art will understand that the features shown in the drawings are for purposes of illustrations, and variations, including different and/or additional features and arrangements thereof, are possible.

FIG. 1F is a block diagram of a network microphone device.

FIG. 1G is a block diagram of a playback device.

FIG. 1H is a partially schematic diagram of a control device.

Figure 1A:
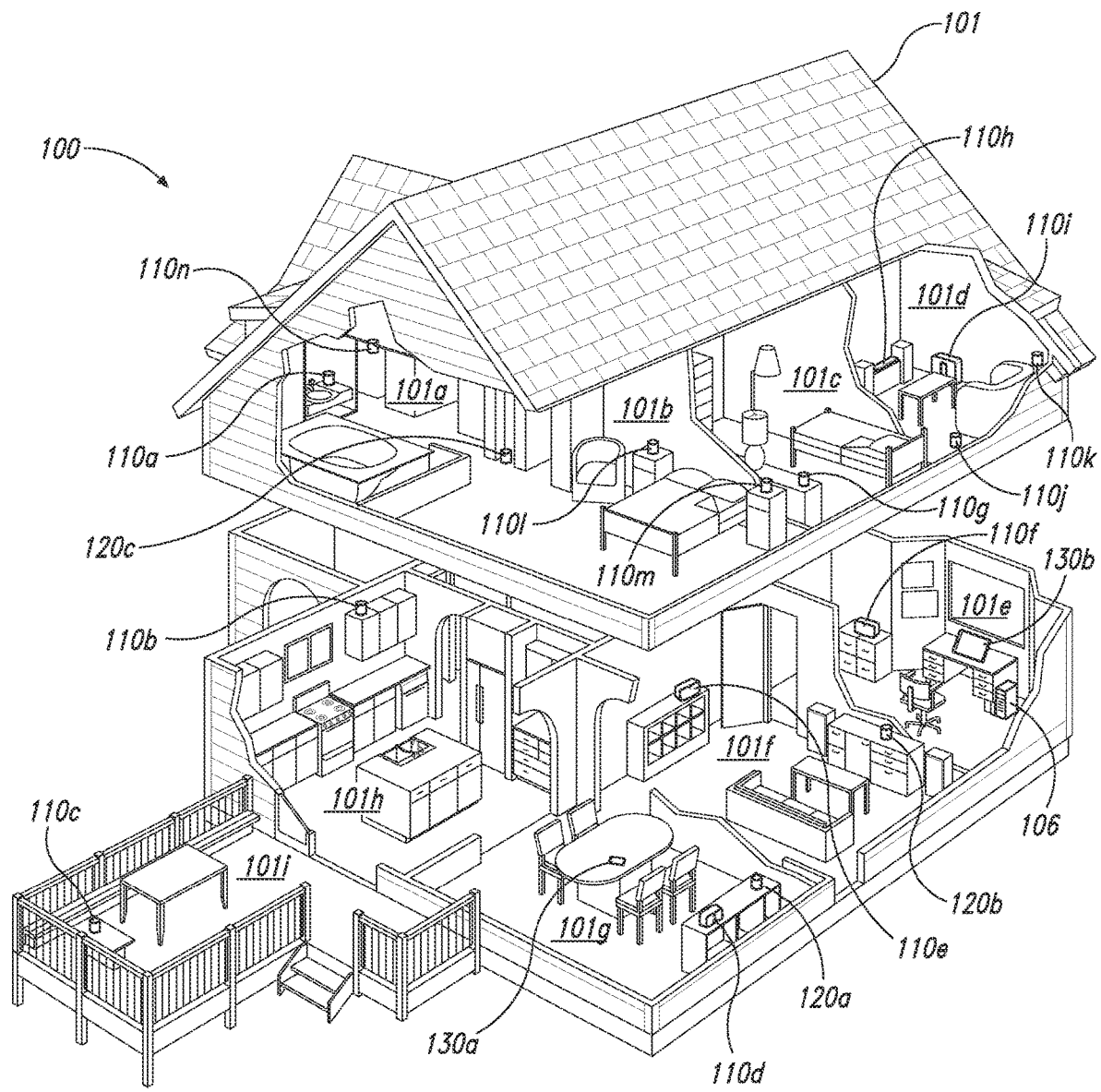
FIG. 1A is a partial cutaway view of an environment having a media playback system configured in accordance with examples of the disclosed technology.

The drawings are for the purpose of illustrating examples of the present technology, but those of ordinary skill in the art will understand that the technology disclosed herein is not limited to the arrangements and/or instrumentality shown in the drawings.

DETAILED DESCRIPTION

I. Overview

Audio playback devices can produce significant amount of heat that varies greatly depending on the operations conditions. If a playback device is exposed to excessive temperature conditions, performance may degrade and/or components of the playback device may be damaged. For example, a playback device may include power supply components that automatically shut off above a certain temperature threshold. Additionally, high temperature conditions can cause failure of computer memory, degradation of the enamel of transformers and voice coils, de-magnetization of transducer magnets, or melting of glue used to hold components of the playback device together.

Conventionally, thermal damage has been avoided by over-engineering audio playback devices so that even under maximum operating conditions (e.g., high ambient temperature, full-volume audio playback, high data transmission via Wi-Fi, etc.), the components are able to withstand the associated temperature levels. However, such over-engineering is expensive and relatively inefficient, since mass-produced devices must be designed to accommodate operating conditions that prevail in only a tiny fraction of real-world situations.

Another approach to avoiding thermal damage is to shut down some or all functions of a playback device altogether once a temperature threshold has been exceeded. For example, once an audio playback device has exceeded 100 degrees C., the device may be completely shut down. Alternatively, certain functions (e.g., Wi-Fi transmission, or audio playback) may be completely shut down while other functions remain operational. In either case, the user experience is negatively impacted, as the playback device abruptly ceases functioning as a result of the high temperature.

To avoid these and other deleterious consequences of excessive temperature, embodiments of the present technology include a thermal controller configured to monitor the temperature of a playback device and make real-time adjustments to audio playback or other device operation to avoid thermal damage. As opposed completely shutting down the device or abruptly terminating audio playback, the intervention can more selectively modulate audio playback or other device operation in a manner that both preserves the user experience while also reducing the thermal load until the temperature has fallen back to an acceptable level.

Adjusting audio playback can include, for example reducing a gain of audio playback (e.g., full-spectrum reduction in amplitude of audio playback for all transducers of a playback device). In some examples, audio playback can be modified in other ways to reduce the temperature. For example, gain reduction may be varied across frequency ranges, such as larger gain reductions in lower frequencies and smaller gain reductions in higher frequencies. In some cases, gain reduction may be applied to some but not all of the transducers, or the amount of gain reduction may vary across the transducers. In some embodiments, other device operations can be modulated in response to excessive heat—for example Bluetooth connectivity may be temporarily disabled, Wi-Fi data transmission can be throttled, processor operation may be constrained without fully shutting down, etc.

In some examples, a playback device includes one or more temperature sensors disposed on, within, or about the device and configured to provide real-time temperature data. In operation, the temperature sensor(s) can obtain temperature data used to determine whether a pre-determined threshold temperature has been exceeded. For example, above a first or lower temperature threshold, the thermal controller may initiate modulation of device operation (e.g., once the temperature exceeds 60 degrees C., a gain reduction or other intervention begins to be applied). If, following the modulation, the temperature falls below the lower temperature threshold, then the modulation (e.g., gain reduction) can be ceased, and the playback device can resume normal operation. If, instead, the temperature stays above the lower temperature threshold, then device operation can continue to be modulated via the thermal controller, with the degree of modulation (e.g., amount of gain reduction) depending on the particular temperature data obtained via the sensors. For example, as the temperature continues to increase beyond the lower temperature threshold, the amount of gain reduction can be increasingly large. If the temperature continues to increase and further exceeds a second or upper temperature threshold (e.g., a maximum safe operating temperature of the playback device), audio playback or other device operation can be suspended and/or the device may be shut down completely. This scenario indicates a failure of the modulation via the thermal controller to reduce the temperature to safe operating levels, and so performance is sacrificed in order to protect the playback device.

In some cases, once the lower threshold temperature has been exceeded, the degree of modulation (e.g., the amount of gain reduction applied to audio playback) can vary depending on the particular temperature increase detected by the temperature sensor(s). In some examples, data obtained via the temperature sensors can be evaluated to determine one or more of: (1) whether the temperature has exceeded the lower temperature threshold; (2) whether the temperature has exceeded the upper temperature threshold; and (3) a temperature parameter that characterizes the change in temperature. The modulation applied (e.g., amount of gain reduction) can be varied based on the temperature parameter, with increasingly robust interventions (e.g., higher gain reductions) applied as the temperature parameter rises (e.g., indicating a higher rate of temperature increase).

The temperature parameter can include, for example, an absolute temperature amount over or above a threshold (e.g., degrees C. beyond the lower threshold), a rate of temperature increase or decrease over time (e.g., degrees C. of increase per second), or other such parameter. In some examples, the temperature parameter includes a time elapsed since the last temperature increase of a pre-determined amount has been detected (e.g., time elapsed since the temperature last increased by at least 1 degree C. over the sampling period of the sensor (e.g., sampled every 10 seconds). In some embodiments, a lookup table or function can define an amount of gain reduction to be applied to audio playback that is dependent on the time elapsed since the last detected rise in temperature of a pre-determined amount. As the rate of temperature increase goes up (as indicated by a decreasing amount of time since the last measured increase of at least 1 degree C.), the amount of gain reduction can be increased.

The heat at any given position of the playback device can be a function of environmental conditions (e.g., ambient temperature of the surrounding air, humidity, etc.), as well as the heat generated from different components of the device (e.g., heat generated by electronic components of a playback device (e.g., Wi-Fi chip, CPU, amplifiers, etc.). As a result, the temperature may vary across the playback device. It can therefore be useful to provide a plurality of discrete temperature sensors distributed about the device, each configured to obtain temperature data for its respective location. If the temperature at any given location exceeds a threshold (as determined by data from one or more of the temperature sensors), audio playback can be adjusted accordingly.

In some embodiments, in addition to one or more physical temperature sensors, one or more virtual sensors can be disposed about the device. Such virtual sensors can represent a predictive model that estimates or models the temperature at a particular location based on, among other things, temperature data from other physical temperature sensors disposed about the device. Such models may also take into account the material properties or elements at or adjacent to the location of the virtual sensor. For example, a virtual sensor may be positioned in an intermediate area between three physical temperature sensors. The virtual sensor can be output a predicted temperature at this location that is based on temperature readings from the three physical temperature sensors, as well as material properties or other aspects of the playback device at or adjacent to the location of the virtual sensor. Throughout this description, a virtual sensor can be used in conjunction with or instead of any one or more of the physical temperature sensors described herein.

In some embodiments, the particular thresholds (e.g., a lower threshold above which playback device operation is modulated, and/or an upper threshold above which the playback device is shut down completely) and/or the particular modulation (e.g., the amount of gain reduction corresponding to a particular temperature parameter) can vary from one temperature sensor to the next. For example, one temperature sensor may be located next to a CPU which cannot safely exceed 100 degrees C., while another temperature sensor may be located next to a transducer that can operate safely until 120 degrees C. In such cases, the temperature thresholds at which the thermal controller initiates modulation of playback device operation can be different between the two sensors.

A thermal controller in accordance with examples of the present technology can advantageously modulate audio playback or other device operation based on a real-time or substantially real-time feedback loop utilizing data collected from one or more temperature sensors. By tailoring the particular modulation to both the temperature level and the magnitude of the temperature increase, a thermal controller can modulate playback device performance to maintain safe operating conditions while also preserving the user's experience by avoiding shutting down operation of the playback device until absolutely necessary.

While some examples described herein may refer to functions performed by given actors such as "users," "listeners," and/or other entities, it should be understood that this is for purposes of explanation only. The claims should not be interpreted to require action by any such example actor unless explicitly required by the language of the claims themselves.

In the Figures, identical reference numbers identify generally similar, and/or identical, elements. To facilitate the discussion of any particular element, the most significant digit or digits of a reference number refers to the Figure in which that element is first introduced. For example, element 110a is first introduced and discussed with reference to FIG. 1A. Many of the details, dimensions, angles and other features shown in the Figures are merely illustrative of particular examples of the disclosed technology. Accordingly, other examples can have other details, dimensions, angles and features without departing from the spirit or scope of the disclosure. In addition, those of ordinary skill in the art will appreciate that further examples of the various disclosed technologies can be practiced without several of the details described below.

II. Suitable Operating Environment

FIG. 1A is a partial cutaway view of a media playback system 100 distributed in an environment 101 (e.g., a house). The media playback system 100 comprises one or more playback devices 110 (identified individually as playback devices 110a-n), one or more network microphone devices ("NMDs"), 120 (identified individually as NMDs 120a-c), and one or more control devices 130 (identified individually as control devices 130a and 130b).

As used herein the term "playback device" can generally refer to a network device configured to receive, process, and output data of a media playback system. For example, a playback device can be a network device that receives and processes audio content. In some examples, a playback device includes one or more transducers or speakers powered by one or more amplifiers. In other examples, however, a playback device includes one of (or neither of) the speaker and the amplifier. For instance, a playback device can comprise one or more amplifiers configured to drive one or more speakers external to the playback device via a corresponding wire or cable.

Moreover, as used herein the term NMD (i.e., a "network microphone device") can generally refer to a network device that is configured for audio detection. In some examples, an NMD is a stand-alone device configured primarily for audio detection. In other examples, an NMD is incorporated into a playback device (or vice versa).

The term "control device" can generally refer to a network device configured to perform functions relevant to facilitating user access, control, and/or configuration of the media playback system 100.

Each of the playback devices 110 is configured to receive audio signals or data from one or more media sources (e.g., one or more remote servers, one or more local devices) and play back the received audio signals or data as sound. The one or more NMDs 120 are configured to receive spoken word commands, and the one or more control devices 130 are configured to receive user input. In response to the received spoken word commands and/or user input, the media playback system 100 can play back audio via one or more of the playback devices 110. In certain examples, the playback devices 110 are configured to commence playback of media content in response to a trigger. For instance, one or more of the playback devices 110 can be configured to play back a morning playlist upon detection of an associated trigger condition (e.g., presence of a user in a kitchen, detection of a coffee machine operation). In some examples, for instance, the media playback system 100 is configured to play back audio from a first playback device (e.g., the playback device 110a) in synchrony with a second playback device (e.g., the playback device 110b). Interactions between the playback devices 110, NMDs 120, and/or control devices 130 of the media playback system 100 configured in accordance with the various examples of the disclosure are described in greater detail below.

In the illustrated example of FIG. 1A, the environment 101 comprises a household having several rooms, spaces, and/or playback zones, including (clockwise from upper left) a master bathroom 101a, a master bedroom 101b, a second bedroom 101c, a family room or den 101d, an office 101e, a living room 101f, a dining room 101g, a kitchen 101h, and an outdoor patio 101i. While certain examples and examples are described below in the context of a home environment, the technologies described herein may be implemented in other types of environments. In some examples, for instance, the media playback system 100 can be implemented in one or more commercial settings (e.g., a restaurant, mall, airport, hotel, a retail or other store), one or more vehicles (e.g., a sports utility vehicle, bus, car, a ship, a boat, an airplane), multiple environments (e.g., a combination of home and vehicle environments), and/or another suitable environment where multi-zone audio may be desirable.

The media playback system 100 can comprise one or more playback zones, some of which may correspond to the rooms in the environment 101. The media playback system 100 can be established with one or more playback zones, after which additional zones may be added, or removed to form, for example, the configuration shown in FIG. 1A. Each zone may be given a name according to a different room or space such as the office 101e, master bathroom 101a, master bedroom 101b, the second bedroom 101c, kitchen 101h, dining room 101g, living room 101f, and/or the balcony 101i. In some examples, a single playback zone may include multiple rooms or spaces. In certain examples, a single room or space may include multiple playback zones.

In the illustrated example of FIG. 1A, the master bathroom 101a, the second bedroom 101c, the office 101e, the living room 101f, the dining room 101g, the kitchen 101h, and the outdoor patio 101i each include one playback device 110, and the master bedroom 101b and the den 101d include a plurality of playback devices 110. In the master bedroom 101b, the playback devices 110l and 110m may be configured, for example, to play back audio content in synchrony as individual ones of playback devices 110, as a bonded playback zone, as a consolidated playback device, and/or any combination thereof. Similarly, in the den 101d, the playback devices 110h-j can be configured, for instance, to play back audio content in synchrony as individual ones of playback devices 110, as one or more bonded playback devices, and/or as one or more consolidated playback devices. Additional details regarding bonded and consolidated playback devices are described below with respect to FIGS. 1B and 1E.

In some examples, one or more of the playback zones in the environment 101 may each be playing different audio content. For instance, a user may be grilling on the patio 101*i* and listening to hip hop music being played by the playback device 110*c* while another user is preparing food in the kitchen 101*h* and listening to classical music played by the playback device 110*b*. In another example, a playback zone may play the same audio content in synchrony with another playback zone. For instance, the user may be in the office 101*e* listening to the playback device 110*f* playing back the same hip-hop music being played back by playback device 110*c* on the patio 101*i*. In some examples, the playback devices 110*c* and 110*f* play back the hip hop music in synchrony such that the user perceives that the audio content is being played seamlessly (or at least substantially seamlessly) while moving between different playback zones. Additional details regarding audio playback synchronization among playback devices and/or zones can be found, for example, in U.S. Pat. No. 8,234,395 entitled, "System and method for synchronizing operations among a plurality of independently clocked digital data processing devices," which is incorporated herein by reference in its entirety.

a. Suitable Media Playback System

Figure 1B:
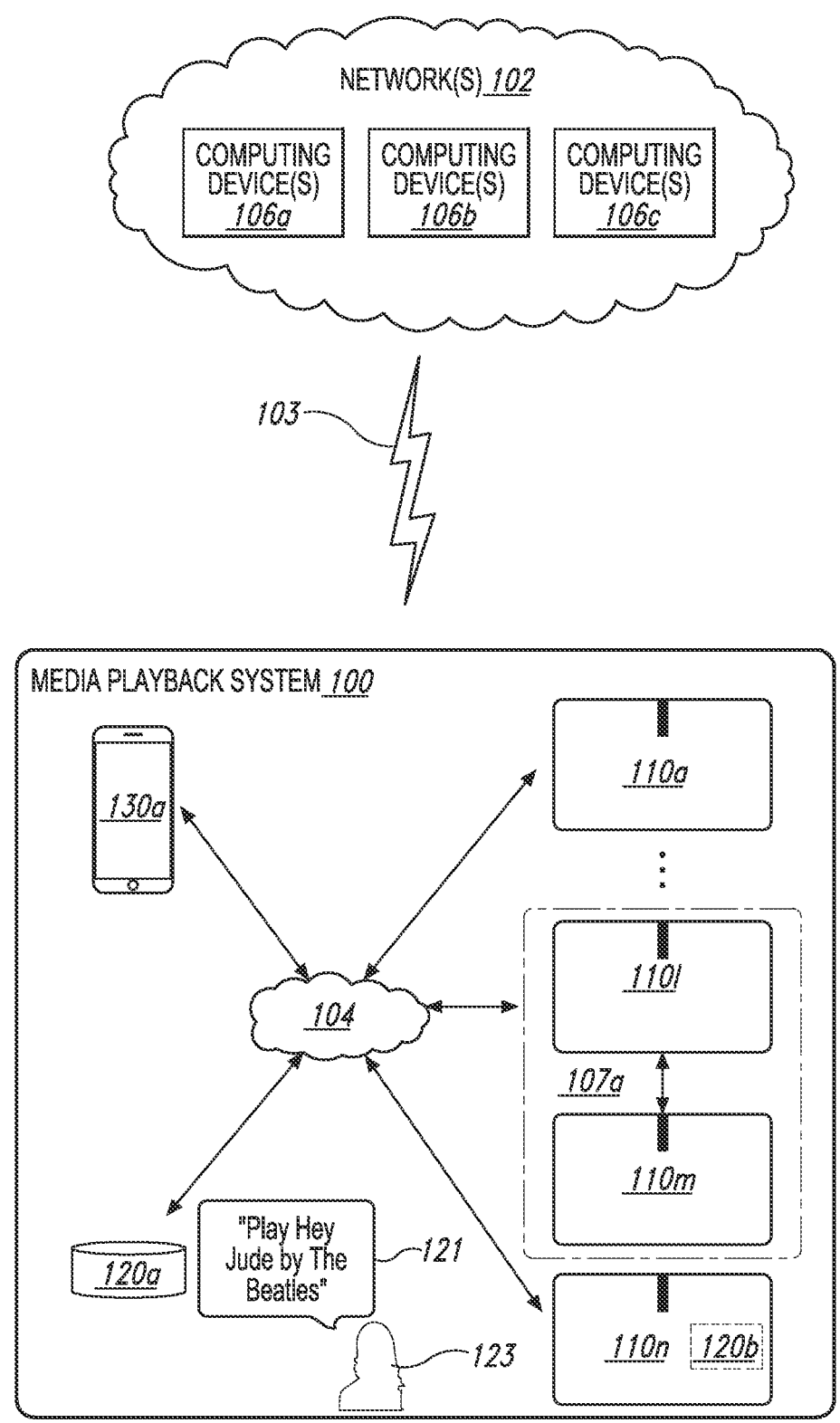
FIG. 1B is a schematic diagram of the media playback system of FIG. 1A and one or more networks.

FIG. 1B is a schematic diagram of the media playback system 100 and a cloud network 102. For ease of illustration, certain devices of the media playback system 100 and the cloud network 102 are omitted from FIG. 1B. One or more communication links 103 (referred to hereinafter as "the links 103") communicatively couple the media playback system 100 and the cloud network 102.

The links 103 can comprise, for example, one or more wired networks, one or more wireless networks, one or more wide area networks (WAN), one or more local area networks (LAN), one or more personal area networks (PAN), one or more telecommunication networks (e.g., one or more Global System for Mobiles (GSM) networks, Code Division Multiple Access (CDMA) networks, Long-Term Evolution (LTE) networks, 5G communication network networks, and/or other suitable data transmission protocol networks), etc. The cloud network 102 is configured to deliver media content (e.g., audio content, video content, photographs, social media content) to the media playback system 100 in response to a request transmitted from the media playback system 100 via the links 103. In some examples, the cloud network 102 is further configured to receive data (e.g. voice input data) from the media playback system 100 and correspondingly transmit commands and/or media content to the media playback system 100.

The cloud network 102 comprises computing devices 106 (identified separately as a first computing device 106*a*, a second computing device 106*b*, and a third computing device 106*c*). The computing devices 106 can comprise individual computers or servers, such as, for example, a media streaming service server storing audio and/or other media content, a voice service server, a social media server, a media playback system control server, etc. In some examples, one or more of the computing devices 106 comprise modules of a single computer or server. In certain examples, one or more of the computing devices 106 comprise one or more modules, computers, and/or servers. Moreover, while the cloud network 102 is described above in the context of a single cloud network, in some examples the cloud network 102 comprises a plurality of cloud networks comprising communicatively coupled computing devices. Furthermore, while the cloud network 102 is shown in FIG. 1B as having three of the computing devices 106, in some examples, the cloud network 102 comprises fewer (or more than) three computing devices 106.

The media playback system 100 is configured to receive media content from the networks 102 via the links 103. The received media content can comprise, for example, a Uniform Resource Identifier (URI) and/or a Uniform Resource Locator (URL). For instance, in some examples, the media playback system 100 can stream, download, or otherwise obtain data from a URI or a URL corresponding to the received media content. A network 104 communicatively couples the links 103 and at least a portion of the devices (e.g., one or more of the playback devices 110, NMDs 120, and/or control devices 130) of the media playback system 100. The network 104 can include, for example, a wireless network (e.g., a Wi-Fi network, a Bluetooth, a Z-Wave network, a ZigBee, and/or other suitable wireless communication protocol network) and/or a wired network (e.g., a network comprising Ethernet, Universal Serial Bus (USB), and/or another suitable wired communication). As those of ordinary skill in the art will appreciate, as used herein, "Wi-Fi" can refer to several different communication protocols including, for example, Institute of Electrical and Electronics Engineers (IEEE) 802.11a, 802.11b, 802.11g, 802.11n, 802.11ac, 802.11ac, 802.11ad, 802.11af, 802.11ah, 802.11ai, 802.11aj, 802.11aq, 802.11ax, 802.11ay, 802.15, etc. transmitted at 2.4 Gigahertz (GHz), 5 GHz, and/or another suitable frequency.

In some examples, the network 104 comprises a dedicated communication network that the media playback system 100 uses to transmit messages between individual devices and/or to transmit media content to and from media content sources (e.g., one or more of the computing devices 106). In certain examples, the network 104 is configured to be accessible only to devices in the media playback system 100, thereby reducing interference and competition with other household devices. In other examples, however, the network 104 comprises an existing household communication network (e.g., a household Wi-Fi network). In some examples, the links 103 and the network 104 comprise one or more of the same networks. In some examples, for instance, the links 103 and the network 104 comprise a telecommunication network (e.g., an LTE network, a 5G network). Moreover, in some examples, the media playback system 100 is implemented without the network 104, and devices comprising the media playback system 100 can communicate with each other, for example, via one or more direct connections, PANs, telecommunication networks, and/or other suitable communication links.

In some examples, audio content sources may be regularly added or removed from the media playback system 100. In some examples, for instance, the media playback system 100 performs an indexing of media items when one or more media content sources are updated, added to, and/or removed from the media playback system 100. The media playback system 100 can scan identifiable media items in some or all folders and/or directories accessible to the playback devices 110, and generate or update a media content database comprising metadata (e.g., title, artist, album, track length) and other associated information (e.g., URIs, URLs) for each identifiable media item found. In some examples, for instance, the media content database is stored on one or more of the playback devices 110, network microphone devices 120, and/or control devices 130.

In the illustrated example of FIG. 1B, the playback devices 110*l* and 110*m* comprise a group 107*a*. The playback devices 110*l* and 110*m* can be positioned in different rooms in a household and be grouped together in the group 107*a* on a temporary or permanent basis based on user input received at the control device 130*a* and/or another control device 130 in the media playback system 100. When arranged in the group 107*a*, the playback devices 110*l* and 110*m* can be configured to play back the same or similar audio content in synchrony from one or more audio content sources. In certain examples, for instance, the group 107*a* comprises a bonded zone in which the playback devices 110*l* and 110*m* comprise left audio and right audio channels, respectively, of multi-channel audio content, thereby producing or enhancing a stereo effect of the audio content. In some examples, the group 107*a* includes additional playback devices 110. In other examples, however, the media playback system 100 omits the group 107*a* and/or other grouped arrangements of the playback devices 110.

The media playback system 100 includes the NMDs 120*a* and 120*d*, each comprising one or more microphones configured to receive voice utterances from a user. In the illustrated example of FIG. 1B, the NMD 120*a* is a stand-alone device and the NMD 120*d* is integrated into the playback device 110*n*. The NMD 120*a*, for example, is configured to receive voice input 121 from a user 123. In some examples, the NMD 120*a* transmits data associated with the received voice input 121 to a voice assistant service (VAS) configured to (i) process the received voice input data and (ii) transmit a corresponding command to the media playback system 100. In some examples, for instance, the computing device 106*c* comprises one or more modules and/or servers of a VAS (e.g., a VAS operated by one or more of SONOS®, AMAZON®, GOOGLE® APPLE®, MICROSOFT®). The computing device 106*c* can receive the voice input data from the NMD 120*a* via the network 104 and the links 103. In response to receiving the voice input data, the computing device 106*c* processes the voice input data (i.e., "Play Hey Jude by The Beatles"), and determines that the processed voice input includes a command to play a song (e.g., "Hey Jude"). The computing device 106*c* accordingly transmits commands to the media playback system 100 to play back "Hey Jude" by the Beatles from a suitable media service (e.g., via one or more of the computing devices 106) on one or more of the playback devices 110.

b. Suitable Playback Devices

Figure 1C:
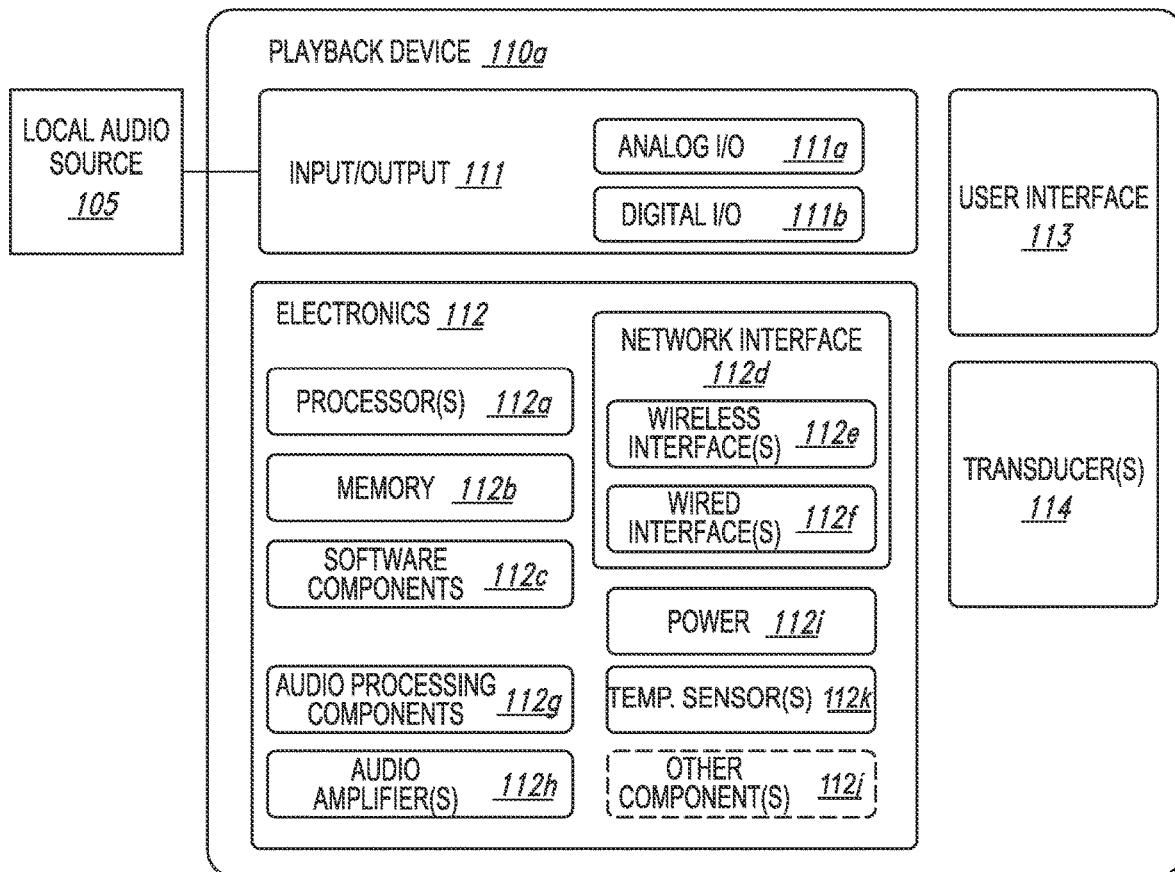
FIG. 1C is a block diagram of a playback device.

FIG. 1C is a block diagram of the playback device 110*a* comprising an input/output 111. The input/output 111 can include an analog I/O 111*a* (e.g., one or more wires, cables, and/or other suitable communication links configured to carry analog signals) and/or a digital I/O 111*b* (e.g., one or more wires, cables, or other suitable communication links configured to carry digital signals). In some examples, the analog I/O 111*a* is an audio line-in input connection comprising, for example, an auto-detecting 3.5 mm audio line-in connection. In some examples, the digital I/O 111*b* comprises a Sony/Philips Digital Interface Format (S/PDIF) communication interface and/or cable and/or a Toshiba Link (TOSLINK) cable. In some examples, the digital I/O 111*b* comprises a High-Definition Multimedia Interface (HDMI) interface and/or cable. In some examples, the digital I/O 111*b* includes one or more wireless communication links comprising, for example, a radio frequency (RF), infrared, WiFi, Bluetooth, or another suitable communication protocol. In certain examples, the analog I/O 111*a* and the digital 111*b* comprise interfaces (e.g., ports, plugs, jacks) configured to receive connectors of cables transmitting analog and digital signals, respectively, without necessarily including cables.

The playback device 110*a*, for example, can receive media content (e.g., audio content comprising music and/or other sounds) from a local audio source 105 via the input/output 111 (e.g., a cable, a wire, a PAN, a Bluetooth connection, an ad hoc wired or wireless communication network, and/or another suitable communication link). The local audio source 105 can comprise, for example, a mobile device (e.g., a smartphone, a tablet, a laptop computer) or another suitable audio component (e.g., a television, a desktop computer, an amplifier, a phonograph, a Blu-ray player, a memory storing digital media files). In some examples, the local audio source 105 includes local music libraries on a smartphone, a computer, a networked-attached storage (NAS), and/or another suitable device configured to store media files. In certain examples, one or more of the playback devices 110, NMDs 120, and/or control devices 130 comprise the local audio source 105. In other examples, however, the media playback system omits the local audio source 105 altogether. In some examples, the playback device 110*a* does not include an input/output 111 and receives all audio content via the network 104.

The playback device 110*a* further comprises electronics 112, a user interface 113 (e.g., one or more buttons, knobs, dials, touch-sensitive surfaces, displays, touchscreens), and one or more transducers 114 (referred to hereinafter as "the transducers 114"). The electronics 112 is configured to receive audio from an audio source (e.g., the local audio source 105) via the input/output 111, one or more of the computing devices 106*a*-*c* via the network 104 (FIG. 1B)), amplify the received audio, and output the amplified audio for playback via one or more of the transducers 114. In some examples, the playback device 110*a* optionally includes one or more microphones 115 (e.g., a single microphone, a plurality of microphones, a microphone array) (hereinafter referred to as "the microphones 115"). In certain examples, for instance, the playback device 110*a* having one or more of the optional microphones 115 can operate as an NMD configured to receive voice input from a user and correspondingly perform one or more operations based on the received voice input.

In the illustrated example of FIG. 1C, the electronics 112 comprise one or more processors 112*a* (referred to hereinafter as "the processors 112*a*"), memory 112*b*, software components 112*c*, a network interface 112*d*, one or more audio processing components 112*g* (referred to hereinafter as "the audio components 112*g*"), one or more audio amplifiers 112*h* (referred to hereinafter as "the amplifiers 112*h*"), and power 112*i* (e.g., one or more power supplies, power cables, power receptacles, batteries, induction coils, Power-over Ethernet (POE) interfaces, and/or other suitable sources of electric power). In some examples, the electronics 112 optionally include one or more other components 112*j* (e.g., one or more sensors, video displays, touchscreens, battery charging bases).

The processors 112*a* can comprise clock-driven computing component(s) configured to process data, and the memory 112*b* can comprise a computer-readable medium (e.g., a tangible, non-transitory computer-readable medium, data storage loaded with one or more of the software components 112*c*) configured to store instructions for performing various operations and/or functions. The processors 112*a* are configured to execute the instructions stored on the memory 112*b* to perform one or more of the operations. The operations can include, for example, causing the playback device 110a to retrieve audio data from an audio source (e.g., one or more of the computing devices 106a-c (FIG. 1B)), and/or another one of the playback devices 110. In some examples, the operations further include causing the playback device 110a to send audio data to another one of the playback devices 110a and/or another device (e.g., one of the NMDs 120). Certain examples include operations causing the playback device 110a to pair with another of the one or more playback devices 110 to enable a multi-channel audio environment (e.g., a stereo pair, a bonded zone).

The processors 112a can be further configured to perform operations causing the playback device 110a to synchronize playback of audio content with another of the one or more playback devices 110. As those of ordinary skill in the art will appreciate, during synchronous playback of audio content on a plurality of playback devices, a listener will preferably be unable to perceive time-delay differences between playback of the audio content by the playback device 110a and the other one or more other playback devices 110. Additional details regarding audio playback synchronization among playback devices can be found, for example, in U.S. Pat. No. 8,234,395, which was incorporated by reference above.

In some examples, the memory 112b is further configured to store data associated with the playback device 110a, such as one or more zones and/or zone groups of which the playback device 110a is a member, audio sources accessible to the playback device 110a, and/or a playback queue that the playback device 110a (and/or another of the one or more playback devices) can be associated with. The stored data can comprise one or more state variables that are periodically updated and used to describe a state of the playback device 110a. The memory 112b can also include data associated with a state of one or more of the other devices (e.g., the playback devices 110, NMDs 120, control devices 130) of the media playback system 100. In some examples, for instance, the state data is shared during predetermined intervals of time (e.g., every 5 seconds, every 10 seconds, every 60 seconds) among at least a portion of the devices of the media playback system 100, so that one or more of the devices have the most recent data associated with the media playback system 100.

The network interface 112d is configured to facilitate a transmission of data between the playback device 110a and one or more other devices on a data network such as, for example, the links 103 and/or the network 104 (FIG. 1B). The network interface 112d is configured to transmit and receive data corresponding to media content (e.g., audio content, video content, text, photographs) and other signals (e.g., non-transitory signals) comprising digital packet data including an Internet Protocol (IP)-based source address and/or an IP-based destination address. The network interface 112d can parse the digital packet data such that the electronics 112 properly receives and processes the data destined for the playback device 110a.

In the illustrated example of FIG. 1C, the network interface 112d comprises one or more wireless interfaces 112e (referred to hereinafter as "the wireless interface 112e"). The wireless interface 112e (e.g., a suitable interface comprising one or more antennae) can be configured to wirelessly communicate with one or more other devices (e.g., one or more of the other playback devices 110, NMDs 120, and/or control devices 130) that are communicatively coupled to the network 104 (FIG. 1B) in accordance with a suitable wireless communication protocol (e.g., Wi-Fi, Bluetooth, LTE). In some examples, the network interface 112d optionally includes a wired interface 112f (e.g., an interface or receptacle configured to receive a network cable such as an Ethernet, a USB-A, USB-C, and/or Thunderbolt cable) configured to communicate over a wired connection with other devices in accordance with a suitable wired communication protocol. In certain examples, the network interface 112d includes the wired interface 112f and excludes the wireless interface 112e. In some examples, the electronics 112 excludes the network interface 112d altogether and transmits and receives media content and/or other data via another communication path (e.g., the input/output 111).

The audio components 112g are configured to process and/or filter data comprising media content received by the electronics 112 (e.g., via the input/output 111 and/or the network interface 112d) to produce output audio signals. In some examples, the audio processing components 112g comprise, for example, one or more digital-to-analog converters (DAC), audio preprocessing components, audio enhancement components, a digital signal processors (DSPs), and/or other suitable audio processing components, modules, circuits, etc. In certain examples, one or more of the audio processing components 112g can comprise one or more subcomponents of the processors 112a. In some examples, the electronics 112 omits the audio processing components 112g. In some examples, for instance, the processors 112a execute instructions stored on the memory 112b to perform audio processing operations to produce the output audio signals.

The amplifiers 112h are configured to receive and amplify the audio output signals produced by the audio processing components 112g and/or the processors 112a. The amplifiers 112h can comprise electronic devices and/or components configured to amplify audio signals to levels sufficient for driving one or more of the transducers 114. In some examples, for instance, the amplifiers 112h include one or more switching or class-D power amplifiers. In other examples, however, the amplifiers include one or more other types of power amplifiers (e.g., linear gain power amplifiers, class-A amplifiers, class-B amplifiers, class-AB amplifiers, class-C amplifiers, class-D amplifiers, class-E amplifiers, class-F amplifiers, class-G and/or class H amplifiers, and/or another suitable type of power amplifier). In certain examples, the amplifiers 112h comprise a suitable combination of two or more of the foregoing types of power amplifiers. Moreover, in some examples, individual ones of the amplifiers 112h correspond to individual ones of the transducers 114. In other examples, however, the electronics 112 includes a single one of the amplifiers 112h configured to output amplified audio signals to a plurality of the transducers 114. In some other examples, the electronics 112 omits the amplifiers 112h.

In the example of FIG. 1C, the playback device 110a further includes temperature sensor(s) 112k. The temperature sensor(s) 112k can include any device, such as a thermocouple or thermistor, capable of detecting temperature. In some examples, multiple discrete temperature sensors 112k can be disposed within, on, or about the playback device 110a in different locations and configured to detect local temperatures at or adjacent those locations. For example, temperature sensors 112k can be disposed adjacent certain electronic components (e.g., adjacent the processor(s) 112a), transducer components (e.g., adjacent the magnets of transducers 114), or any suitable location of the playback device. In some examples, the playback device 110a includes 1, 2, 3, 4, 5, 6, 7, 8, 9, 10 or more discrete temperature sensors 112k. As described in more detail below, the temperature sensor(s) 112k can be communicatively coupled to the processor(s) 112a or other suitable components such that, based on data from the temperature sensor(s) 112k, audio playback via the playback device 110a can be modulated. For example, if temperature readings exceed a predetermined threshold, a gain of the audio playback may be gradually decreased to protect the device from thermal damage. Once temperature data obtained via the temperature sensor(s) 112k indicates that temperature has fallen below pre-determined threshold, the gain can be restored.

The transducers 114 (e.g., one or more speakers and/or speaker drivers) receive the amplified audio signals from the amplifier 112h and render or output the amplified audio signals as sound (e.g., audible sound waves having a frequency between about 20 Hertz (Hz) and 20 kilohertz (kHz)). In some examples, the transducers 114 can comprise a single transducer. In other examples, however, the transducers 114 comprise a plurality of audio transducers. In some examples, the transducers 114 comprise more than one type of transducer. For example, the transducers 114 can include one or more low frequency transducers (e.g., subwoofers, woofers), mid-range frequency transducers (e.g., mid-range transducers, mid-woofers), and one or more high frequency transducers (e.g., one or more tweeters). As used herein, "low frequency" can generally refer to audible frequencies below about 500 Hz, "mid-range frequency" can generally refer to audible frequencies between about 500 Hz and about 2 kHz, and "high frequency" can generally refer to audible frequencies above 2 kHz. In certain examples, however, one or more of the transducers 114 comprise transducers that do not adhere to the foregoing frequency ranges. For example, one of the transducers 114 may comprise a mid-woofer transducer configured to output sound at frequencies between about 200 Hz and about 5 kHz.

Figure 1D:
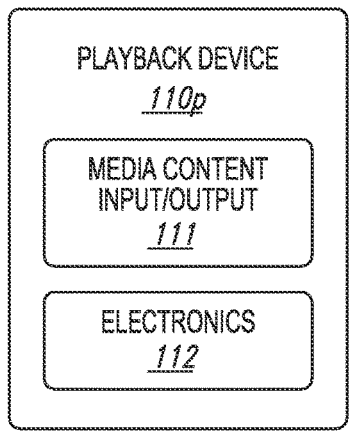
FIG. 1D is a block diagram of a playback device.

By way of illustration, SONOS, Inc. presently offers (or has offered) for sale certain playback devices including, for example, a "SONOS ONE," "MOVE," "PLAY:5," "BEAM," "PLAYBAR," "PLAYBASE," "PORT," "BOOST," "AMP," and "SUB." Other suitable playback devices may additionally or alternatively be used to implement the playback devices of example examples disclosed herein. Additionally, one of ordinary skilled in the art will appreciate that a playback device is not limited to the examples described herein or to SONOS product offerings. In some examples, for instance, one or more playback devices 110 comprises wired or wireless headphones (e.g., over-the-ear headphones, on-ear headphones, in-ear earphones). In other examples, one or more of the playback devices 110 comprise a docking station and/or an interface configured to interact with a docking station for personal mobile media playback devices. In certain examples, a playback device may be integral to another device or component such as a television, a lighting fixture, or some other device for indoor or outdoor use. In some examples, a playback device omits a user interface and/or one or more transducers. For example, FIG. 1D is a block diagram of a playback device 110p comprising the input/output 111 and electronics 112 without the user interface 113 or transducers 114.

Figure 1E:
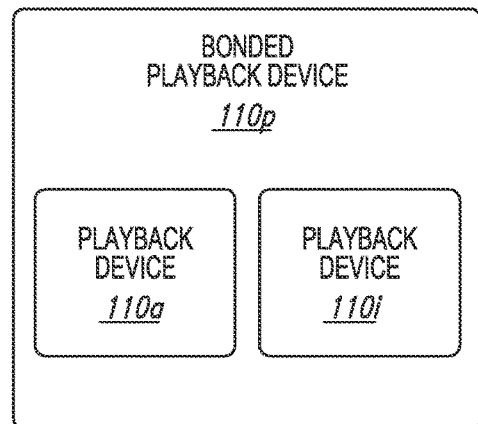
FIG. 1E is a block diagram of a network microphone device.

FIG. 1E is a block diagram of a bonded playback device 110q comprising the playback device 110a (FIG. 1C) sonically bonded with the playback device 110i (e.g., a subwoofer) (FIG. 1A). In the illustrated example, the playback devices 110a and 110i are separate ones of the playback devices 110 housed in separate enclosures. In some examples, however, the bonded playback device 110q comprises a single enclosure housing both the playback devices 110a and 110i. The bonded playback device 110q can be configured to process and reproduce sound differently than an unbonded playback device (e.g., the playback device 110a of FIG. 1C) and/or paired or bonded playback devices (e.g., the playback devices 110l and 110m of FIG. 1B). In some examples, for instance, the playback device 110a is full-range playback device configured to render low frequency, mid-range frequency, and high frequency audio content, and the playback device 110i is a subwoofer configured to render low frequency audio content. In some examples, the playback device 110a, when bonded with the first playback device, is configured to render only the mid-range and high frequency components of a particular audio content, while the playback device 110i renders the low frequency component of the particular audio content. In some examples, the bonded playback device 110q includes additional playback devices and/or another bonded playback device. Additional playback device examples are described in further detail below with respect to FIGS. 2A-2C.

c. Suitable Network Microphone Devices (NMDs)

FIG. 1F is a block diagram of the NMD 120a (FIGS. 1A and 1B). The NMD 120a includes one or more voice processing components 124 (hereinafter "the voice components 124") and several components described with respect to the playback device 110a (FIG. 1C) including the processors 112a, the memory 112b, and the microphones 115. The NMD 120a optionally comprises other components also included in the playback device 110a (FIG. 1C), such as the user interface 113 and/or the transducers 114. In some examples, the NMD 120a is configured as a media playback device (e.g., one or more of the playback devices 110), and further includes, for example, one or more of the audio components 112g (FIG. 1C), the amplifiers 114, and/or other playback device components. In certain examples, the NMD 120a comprises an Internet of Things (IoT) device such as, for example, a thermostat, alarm panel, fire and/or smoke detector, etc. In some examples, the NMD 120a comprises the microphones 115, the voice processing components 124, and only a portion of the components of the electronics 112 described above with respect to FIG. 1B. In some examples, for instance, the NMD 120a includes the processor 112a and the memory 112b (FIG. 1B), while omitting one or more other components of the electronics 112. In some examples, the NMD 120a includes additional components (e.g., one or more sensors, cameras, thermometers, barometers, hygrometers).

In some examples, an NMD can be integrated into a playback device. FIG. 1G is a block diagram of a playback device 110r comprising an NMD 120d. The playback device 110r can comprise many or all of the components of the playback device 110a and further include the microphones 115 and voice processing components 124 (FIG. 1F). The playback device 110r optionally includes an integrated control device 130c. The control device 130c can comprise, for example, a user interface (e.g., the user interface 113 of FIG. 1B) configured to receive user input (e.g., touch input, voice input) without a separate control device. In other examples, however, the playback device 110r receives commands from another control device (e.g., the control device 130a of FIG. 1B).

Referring again to FIG. 1F, the microphones 115 are configured to acquire, capture, and/or receive sound from an environment (e.g., the environment 101 of FIG. 1A) and/or a room in which the NMD 120a is positioned. The received sound can include, for example, vocal utterances, audio played back by the NMD 120a and/or another playback device, background voices, ambient sounds, etc. The microphones 115 convert the received sound into electrical signals to produce microphone data. The voice processing components 124 receive and analyzes the microphone data to determine whether a voice input is present in the microphone data. The voice input can comprise, for example, an activation word followed by an utterance including a user request. As those of ordinary skill in the art will appreciate, an activation word is a word or other audio cue that signifying a user voice input. For instance, in querying the AMAZON® VAS, a user might speak the activation word "Alexa." Other examples include "Ok, Google" for invoking the GOOGLE® VAS and "Hey, Siri" for invoking the APPLE® VAS.

After detecting the activation word, voice processing components 124 monitor the microphone data for an accompanying user request in the voice input. The user request may include, for example, a command to control a third-party device, such as a thermostat (e.g., NEST® thermostat), an illumination device (e.g., a PHILIPS HUE® lighting device), or a media playback device (e.g., a Sonos® playback device). For example, a user might speak the activation word "Alexa" followed by the utterance "set the thermostat to 68 degrees" to set a temperature in a home (e.g., the environment 101 of FIG. 1A). The user might speak the same activation word followed by the utterance "turn on the living room" to turn on illumination devices in a living room area of the home. The user may similarly speak an activation word followed by a request to play a particular song, an album, or a playlist of music on a playback device in the home.

d. Suitable Control Devices

FIG. 1H is a partially schematic diagram of the control device 130a (FIGS. 1A and 1B). As used herein, the term "control device" can be used interchangeably with "controller" or "control system." Among other features, the control device 130a is configured to receive user input related to the media playback system 100 and, in response, cause one or more devices in the media playback system 100 to perform an action(s) or operation(s) corresponding to the user input. In the illustrated example, the control device 130a comprises a smartphone (e.g., an iPhone™, an Android phone) on which media playback system controller application software is installed. In some examples, the control device 130a comprises, for example, a tablet (e.g., an iPad™), a computer (e.g., a laptop computer, a desktop computer), and/or another suitable device (e.g., a television, an automobile audio head unit, an IoT device). In certain examples, the control device 130a comprises a dedicated controller for the media playback system 100. In other examples, as described above with respect to FIG. 1G, the control device 130a is integrated into another device in the media playback system 100 (e.g., one more of the playback devices 110, NMDs 120, and/or other suitable devices configured to communicate over a network).

The control device 130a includes electronics 132, a user interface 133, one or more speakers 134, and one or more microphones 135. The electronics 132 comprise one or more processors 132a (referred to hereinafter as "the processors 132a"), a memory 132b, software components 132c, and a network interface 132d. The processor 132a can be configured to perform functions relevant to facilitating user access, control, and configuration of the media playback system 100. The memory 132b can comprise data storage that can be loaded with one or more of the software components executable by the processor 132a to perform those functions. The software components 132c can comprise applications and/or other executable software configured to facilitate control of the media playback system 100. The memory 112b can be configured to store, for example, the software components 132c, media playback system controller application software, and/or other data associated with the media playback system 100 and the user.

The network interface 132d is configured to facilitate network communications between the control device 130a and one or more other devices in the media playback system 100, and/or one or more remote devices. In some examples, the network interface 132d is configured to operate according to one or more suitable communication industry standards (e.g., infrared, radio, wired standards including IEEE 802.3, wireless standards including IEEE 802.11a, 802.11b, 802.11g, 802.11n, 802.11ac, 802.15, 4G, LTE). The network interface 132d can be configured, for example, to transmit data to and/or receive data from the playback devices 110, the NMDs 120, other ones of the control devices 130, one of the computing devices 106 of FIG. 1B, devices comprising one or more other media playback systems, etc. The transmitted and/or received data can include, for example, playback device control commands, state variables, playback zone and/or zone group configurations. For instance, based on user input received at the user interface 133, the network interface 132d can transmit a playback device control command (e.g., volume control, audio playback control, audio content selection) from the control device 130 to one or more of the playback devices 110. The network interface 132d can also transmit and/or receive configuration changes such as, for example, adding/removing one or more playback devices 110 to/from a zone, adding/removing one or more zones to/from a zone group, forming a bonded or consolidated player, separating one or more playback devices from a bonded or consolidated player, among others.

The user interface 133 is configured to receive user input and can facilitate control of the media playback system 100. The user interface 133 includes media content art 133a (e.g., album art, lyrics, videos), a playback status indicator 133b (e.g., an elapsed and/or remaining time indicator), media content information region 133c, a playback control region 133d, and a zone indicator 133e. The media content information region 133c can include a display of relevant information (e.g., title, artist, album, genre, release year) about media content currently playing and/or media content in a queue or playlist. The playback control region 133d can include selectable (e.g., via touch input and/or via a cursor or another suitable selector) icons to cause one or more playback devices in a selected playback zone or zone group to perform playback actions such as, for example, play or pause, fast forward, rewind, skip to next, skip to previous, enter/exit shuffle mode, enter/exit repeat mode, enter/exit cross fade mode, etc. The playback control region 133d may also include selectable icons to modify equalization settings, playback volume, and/or other suitable playback actions. In the illustrated example, the user interface 133 comprises a display presented on a touch screen interface of a smartphone (e.g., an iPhone™, an Android phone). In some examples, however, user interfaces of varying formats, styles, and interactive sequences may alternatively be implemented on one or more network devices to provide comparable control access to a media playback system.

The one or more speakers 134 (e.g., one or more transducers) can be configured to output sound to the user of the control device 130a. In some examples, the one or more speakers comprise individual transducers configured to correspondingly output low frequencies, mid-range frequencies, and/or high frequencies. In some examples, for instance, the control device 130a is configured as a playback device (e.g., one of the playback devices 110). Similarly, in some examples the control device 130a is configured as an NMD (e.g., one of the NMDs 120), receiving voice commands and other sounds via the one or more microphones 135.

The one or more microphones 135 can comprise, for example, one or more condenser microphones, electret condenser microphones, dynamic microphones, and/or other suitable types of microphones or transducers. In some examples, two or more of the microphones 135 are arranged to capture location information of an audio source (e.g., voice, audible sound) and/or configured to facilitate filtering of background noise. Moreover, in certain examples, the control device 130a is configured to operate as playback device and an NMD. In other examples, however, the control device 130a omits the one or more speakers 134 and/or the one or more microphones 135. For instance, the control device 130a may comprise a device (e.g., a thermostat, an IoT device, a network device) comprising a portion of the electronics 132 and the user interface 133 (e.g., a touch screen) without any speakers or microphones.

III. Example Systems and Methods for Thermal Control of Playback Devices

Figure 2A:
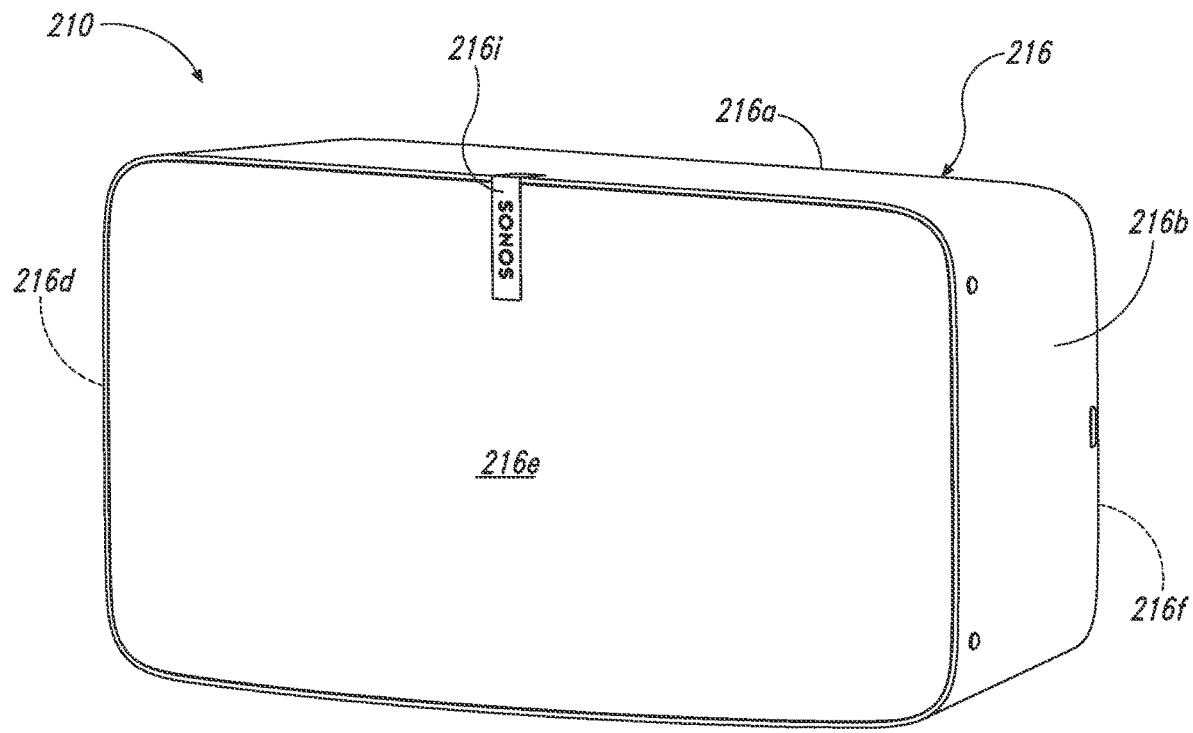
FIG. 2A is a front isometric view of a playback device configured in accordance with examples of the disclosed technology.
Figure 2B:
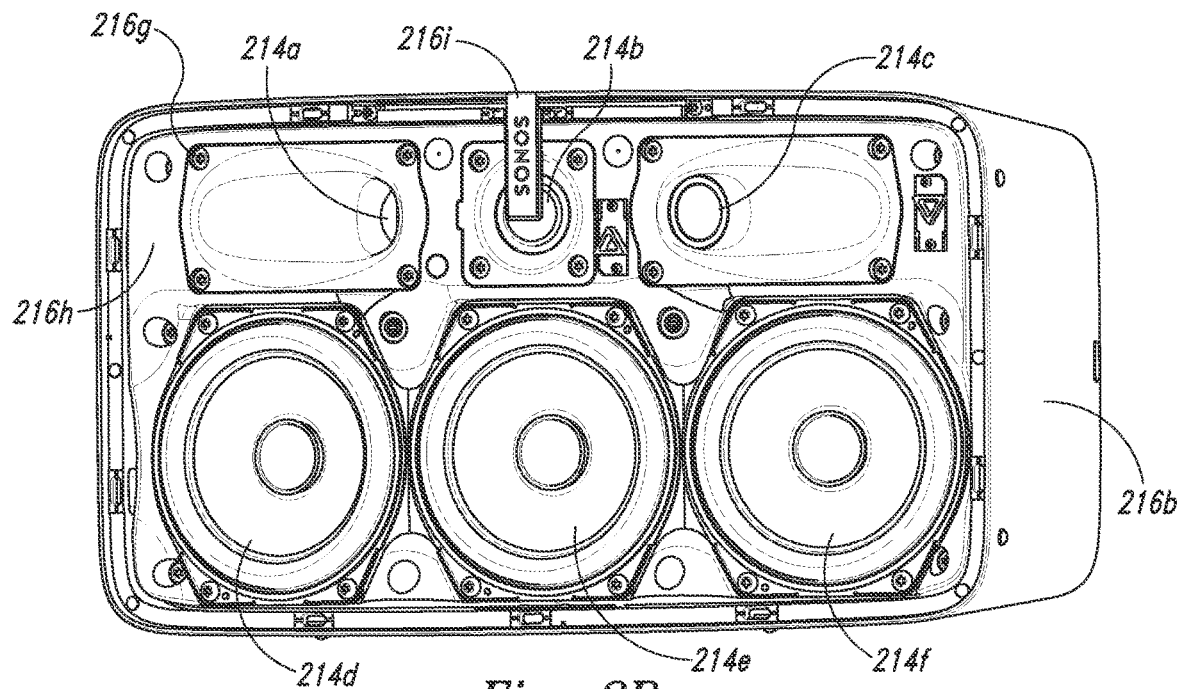
FIG. 2B is a front isometric view of the playback device of FIG. 2A without a grille.
Figure 2C:
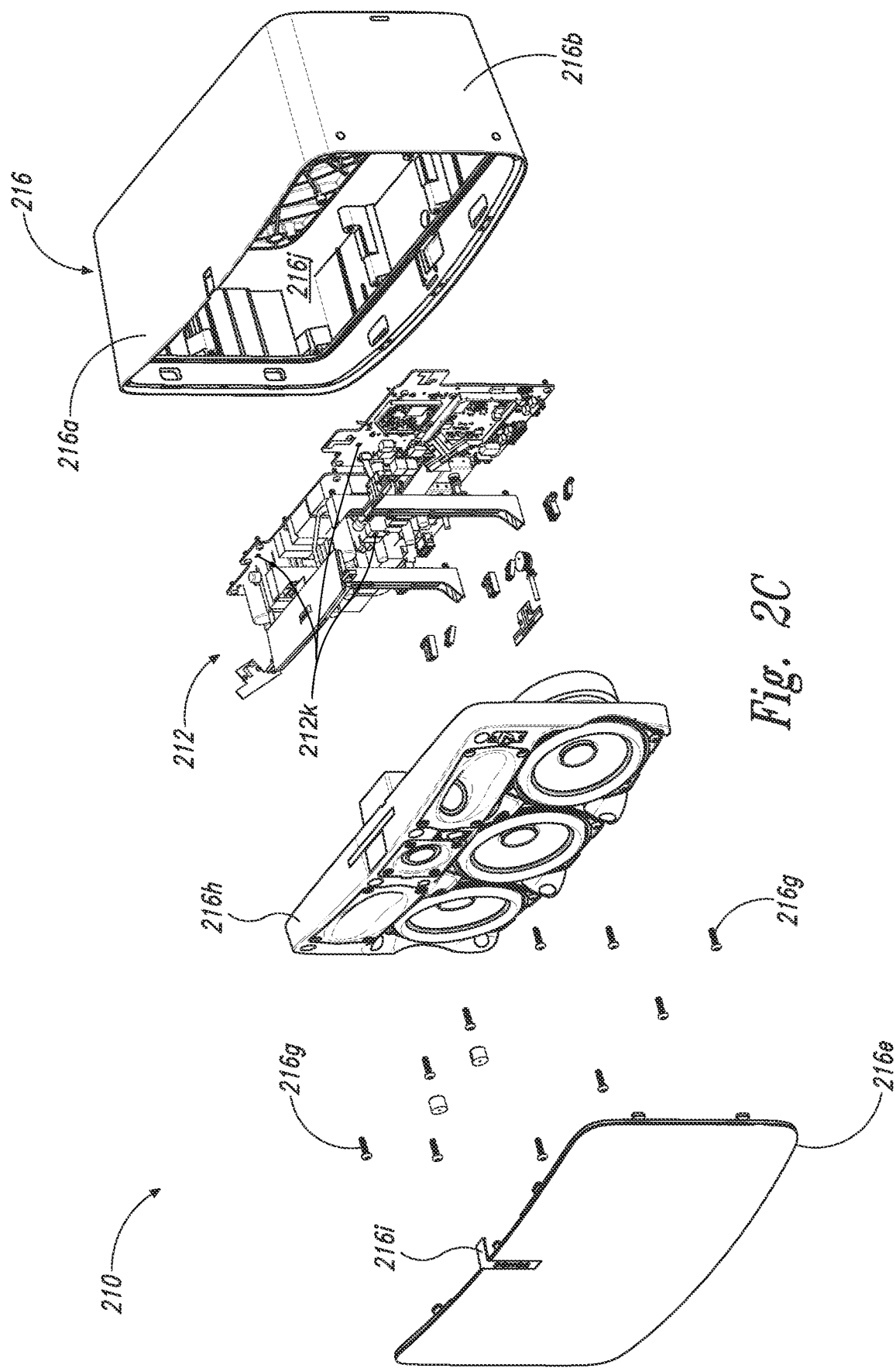
FIG. 2C is an exploded view of the playback device of FIG. 2A.

FIG. 2A is a front isometric view of a playback device 210 configured in accordance with examples of the disclosed technology. FIG. 2B is a front isometric view of the playback device 210 without a grille 216e. FIG. 2C is an exploded view of the playback device 210. Referring to FIGS. 2A-2C together, the playback device 210 comprises a housing 216 that includes an upper portion 216a, a right or first side portion 216b, a lower portion 216c, a left or second side portion 216d, the grille 216e, and a rear portion 216f. A plurality of fasteners 216g (e.g., one or more screws, rivets, clips) attaches a frame 216h to the housing 216. A cavity 216j (FIG. 2C) in the housing 216 is configured to receive the frame 216h and electronics 212. The frame 216h is configured to carry a plurality of transducers 214 (identified individually in FIG. 2B as transducers 214a-f). The electronics 212 (e.g., the electronics 112 of FIG. 1C) is configured to receive audio content from an audio source and send electrical signals corresponding to the audio content to the transducers 214 for playback.

The transducers 214 are configured to receive the electrical signals from the electronics 112, and further configured to convert the received electrical signals into audible sound during playback. For instance, the transducers 214a-c (e.g., tweeters) can be configured to output high frequency sound (e.g., sound waves having a frequency greater than about 2 kHz). The transducers 214d-f (e.g., mid-woofers, woofers, midrange speakers) can be configured output sound at frequencies lower than the transducers 214a-c (e.g., sound waves having a frequency lower than about 2 kHz). In some examples, the playback device 210 includes a number of transducers different than those illustrated in FIGS. 2A-2C. For example, as described in further detail below with respect to FIGS. 3A-3C, the playback device 210 can include fewer than six transducers (e.g., one, two, three). In other examples, however, the playback device 210 includes more than six transducers (e.g., nine, ten). Moreover, in some examples, all or a portion of the transducers 214 are configured to operate as a phased array to desirably adjust (e.g., narrow or widen) a radiation pattern of the transducers 214, thereby altering a user's perception of the sound emitted from the playback device 210.

In the illustrated example of FIGS. 2A-2C, a filter 216i is axially aligned with the transducer 214b. The filter 216i can be configured to desirably attenuate a predetermined range of frequencies that the transducer 214b outputs to improve sound quality and a perceived sound stage output collectively by the transducers 214. In some examples, however, the playback device 210 omits the filter 216i. In other examples, the playback device 210 includes one or more additional filters aligned with the transducers 214b and/or at least another of the transducers 214.

As seen in FIG. 2C, a plurality of temperature sensors 212k can be disposed within the playback device 210. For example, the temperature sensors 212k can be coupled to the electronics 212. However, in some examples, one or more of the temperature sensors 212k can be disposed in other positions, such as on or adjacent to the transducers 214, or on or adjacent to the housing 216. The temperature sensors 212k can be any suitable devices configured to detect temperature, such as thermocouples or thermistors. In operation, temperature data obtained via the temperature sensors 212k can be used to modulate operation of the playback device 210 to reduce the risk of thermal damage. For example, a gain of audio playback can be temporarily reduced based on temperature data obtained via one or more of the temperature sensors 212k, as described in more detail elsewhere herein.

Figure 3:
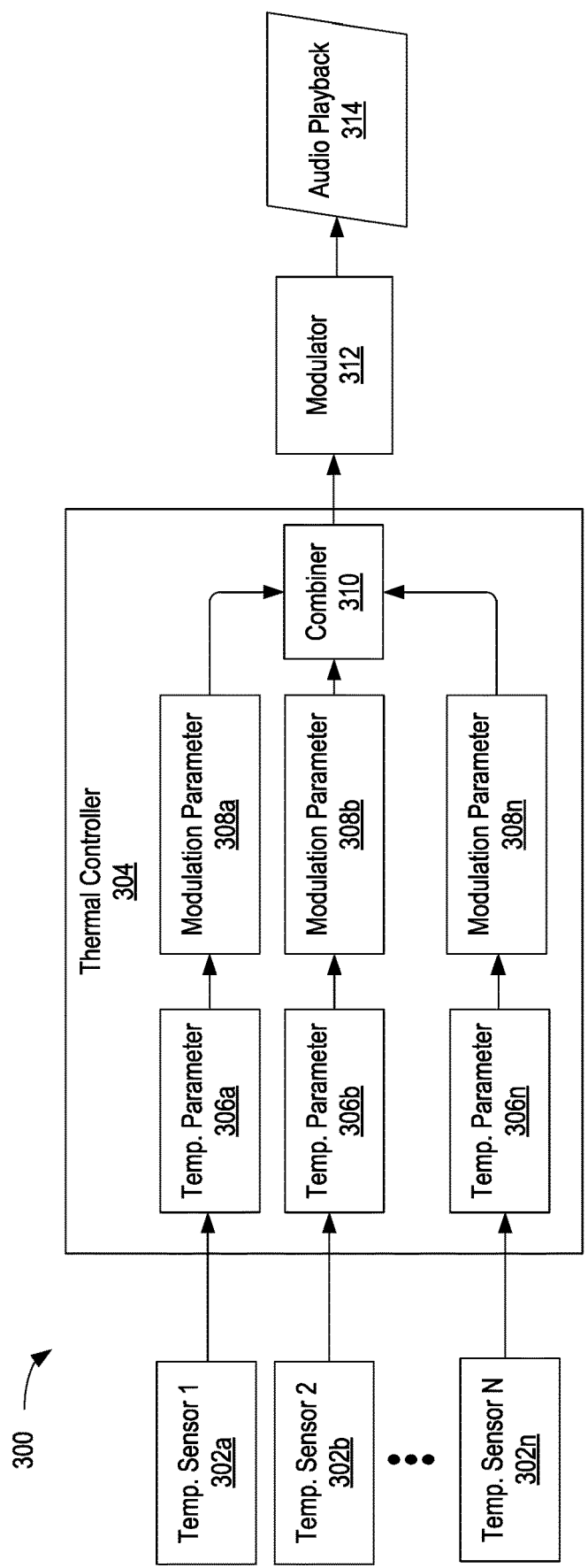
FIG. 3 is a schematic block diagram of a thermal control system for a playback device in accordance with examples of the present technology.

FIG. 3 is a schematic block diagram of a system 300 for thermal control of a playback device. The system 300 includes a plurality of temperature sensors 302a—n (collectively "sensors 302") that provide input (e.g., temperature data) to a thermal controller 304. The thermal controller 304, in turn, provides an output (e.g., a modulation parameter such as an amount of gain reduction) to a modulator 312. The modulator 312 can modulate operation of the playback device (e.g., by reducing gain of audio playback), which proceeds with audio playback in block 314.

The thermal controller 304 can include, for example, instructions stored in memory (e.g. memory 112b of FIG. 1C) executed by one or more processors (e.g., processor(s) 112a of FIG. 1C). The modulator 312 can be included within the audio processing components 112g (FIG. 1C) and/or the audio amplifiers 112h (FIG. 1C). In some examples, the thermal controller 304 and/or the modulator 312 can be discrete components that are separate from the processor 112a, audio processing components 112g, and/or audio amplifiers 112h.

As noted above, in some examples, a playback device can include a plurality of temperature sensors 302 disposed on, within, or about the playback device. In various implementations, the number of temperature sensors 302 can vary, for example, 1, 2, 3, 4, 5, 6, 7, 8, 9, 10 or more temperature sensors. The temperature sensors 302 may include thermocouples, thermistors, or any other suitable sensor configured to detect temperature. The temperature sensors 302 can provide data to the thermal controller 304. The output data can include temperature readings, such as absolute temperature readings, relative temperature readings (e.g., temperature increase or decrease relative to the previous sample), etc. In some examples, the temperature sensors 302 can each output temperature data at a sampling rate. For example, the temperature sensors 302 can output temperature data to the thermal controller 304 at a sampling rate of one temperature reading every 1, 2, 3, 4, 5, 6, 7, 8, 9, 10, 11, 12, 13, 14, 15, 16, 17, 18, 19, or every 20 seconds. The sampling rate may be the same for some or all of the temperature sensors 302, or the sampling rate may vary among some or all of the temperature sensors 302.

In some examples, the temperature sensors 302 be configured such that the temperature data provided by the sensors 302 is quantized. For instance, the temperature sensors 302 can be configured to output temperature data in increments of 1 degree C. (or other suitable quantity). As described in more detail elsewhere herein, this quantization can be used to assess whether data from one or more temperature sensors 302 indicates the playback device to be in a rising, steady, or falling thermal state, and may also be used to determine or characterize a rate of increase or decrease in temperature. The quantization may be the same for some or all of the temperature sensors 302, or the quantization may vary among some or all of the temperature sensors 302.

In some cases, temperature data obtained via the temperature sensors 302 can be "debounced" to reduce or eliminate noise in the temperature readings. For example, relatively small changes in temperature data (e.g., a change at the lowest quantization, such as 1 degree C.) may be discarded until they persist for a predetermined time or a predetermined number of samples. In some examples, changes of temperature at the lowest detectable increment (e.g., 1 degree C.) may be discarded until they persist for at least 30 seconds, at least 1 minute, at least 90 seconds, or at least 2 minutes.

As shown in FIG. 3, the temperature data from each sensor 302 can be supplied to the thermal controller 304 to generate respective temperature parameters 306a, 306b, and 306n (collectively "temperature parameters 306"). The temperature parameters 306 can be calculated or determined based on input from the temperature sensors 302 and used to characterize one or both of (1) a real-time (or substantially real-time) indication of the temperature at that temperature senor and (2) a rate or gradient of the temperature change at that temperature sensor.

In some examples, the temperature parameters 306 can include a rate or gradient of change of the temperature over time, based on data obtained via the respective temperature sensors 302. For example, the temperature parameters 306 can include a rate of change (e.g., degrees C. per second). Additionally or alternatively, the temperature parameters 306 can include a temperature inverse gradient (i.e., a time elapsed since the last detected temperature change of at least a pre-determined amount (e.g., at least about 0.5, 1, 1.5, 2.0, 2.5 degrees C.)). Characterizing a time elapsed since the last temperature change of a predetermined amount (e.g., the time elapsed since the last temperature increase of at least 1 degree C.) can indicate a rate of temperature increase, with smaller time elapsed indicating a higher rate of temperature increase. As described below, operation of the playback device can be modulated to a greater or lesser degree depending on this characterization. If the temperature is deemed to be increasing rapidly, greater modulation (e.g., higher gain reduction) may be warranted. Conversely, if the temperature is deemed to be increasingly slowly or remaining steady, operation of the playback device may be modulated more incrementally (e.g., lower levels of gain reduction), even if the temperature exceeds a pre-determined threshold at which modulation may be initiated.

In some embodiments, using an inverse temperature gradient (e.g., a time elapsed over which the temperature rises by a pre-determined amount) can provide certain advantages over other parameters, such as an absolute rate of temperature change. For example, an inverse temperature gradient is relatively easy to measure using standard sensor components. Additionally, for most heating processes typical to a playback device, using a temperature inverse gradient allows one to easily predict a final temperature (in the absence of intervention) and how long it will take the playback device to reach that temperature. This in turn allows one to quickly estimate the power reduction (or other modulation) needed to prevent the playback device from exceeding the maximum allowable threshold temperature.

The temperature parameters 306 may then be used to determine or calculate respective modulation parameters 308a, 308b, and 308n (collectively "modulation parameters 308"). These modulation parameters 308 can include a potential modulation of operation of the playback device based on the particular temperature parameter 306. As noted elsewhere herein, modulation of operation of the playback device can include one or more of: reduction (or increase) of gain of audio playback across the full spectrum, a reduction (or increase) of gain of audio playback in a manner that varies across frequency ranges, a reduction (or increase) in wireless communication (e.g., throttling Wi-Fi or Bluetooth transmission or reception), or any other modification of operation of the playback device that may affect the temperature of the playback device.

In some examples, the thermal controller 304 is configured such that modulation of audio playback is performed only within particular temperature ranges. For example, below a first or lower temperature threshold (e.g., no temperature sensor 302 indicates a temperature at or above the lower temperature threshold), there may be no modulation of the playback device. As such, the modulation parameters 308 may each be 0 or otherwise indicate no modification of operation of the playback device. In this state, the thermal controller 304 may effectively be a passive component, having no effect on operation of the playback device. This reflects a condition in which the playback device is deemed to be operating within safe temperature levels, and no temperature sensor indicates a temperature level that poses risk to components of the playback device. In various examples, this first or lower temperature threshold can be about 20, 25, 30, 35, 40, 45, 50, 60, 65, or about 70 degrees C. In some examples, the lower temperature threshold can be the same for some or all of the temperature sensors 302. In some examples, the lower temperature threshold can vary among some or all of the temperature sensors 302.

Additionally or alternatively, the thermal controller 304 is configured such, above a second or upper temperature threshold, audio playback is ceased completely, and/or the playback device is shut down completely. As such, the modulation parameter 308 associated with any temperature sensor whose data exceeds the upper threshold can indicate a partial or total shutdown of the playback device. Based on this modulation parameter 308, the modulator 312 can cease audio playback and/or completely shut down operation of the playback device. This upper temperature threshold can reflect a maximum safe operating temperature, such that exceeding this temperature threshold may inflict permanent damage to components of the playback device. In various examples, this second or upper temperature threshold can be about 35, 40, 45, 50, 55, 60, 70, 75, 80, 85, 90, 95, 100, 105, 110, 115, or about 120 degrees C. In some examples, the upper temperature threshold can be the same for some or all of the temperature sensors 302. In some examples, the upper temperature threshold can vary among some or all of the temperature sensors 302.

The lower temperature threshold and upper temperature threshold can together define an operating range in which the thermal controller modulates operation of the playback device (e.g., by reducing gain). In some embodiments, the difference between the lower temperature threshold and the upper temperature threshold can be about 2, 3, 4, 5, 6, 7, 8, 9, 10, 11, 12, 13, 14, 15, 16, 17, 18, 19, or 20 degrees C. or more.

As noted previously, the particular modulation parameters 308 characterizing an amount or degree of modulation (e.g., an amount of gain reduction) may vary depending on the corresponding temperature parameters 306. In some examples, the temperature parameters 306 can indicate both on an absolute temperature (e.g., whether the temperature is above or below the lower threshold and whether the temperature is above, at, near, or below the upper threshold) as well as the change or rate of change of the temperature. As described in more detail below with respect to FIG. 4, the particular modulation may depend on whether the temperature is deemed to be rising, falling, or steady. Additionally, the degree of modulation (e.g., the amount of gain reduction) can vary depending on the amount or rate of temperature change. For example, if the temperature is rising more rapidly (e.g., less time elapsed since the last detected temperature increase of at least 1 degree C.), the gain may be reduced by a greater amount than if the temperature is rising more slowly or is remaining steady.

With continued reference to FIG. 3, each of the modulation parameters 308 may reflect a different potential modification of operation of the playback device. For example, the first modulation parameter 308a may output a gain reduction of 0.1 dB, the second modulation parameter may output a gain reduction of 2 dB, and the nth modulation parameter 308n may output a gain reduction of 0 dB (i.e., no gain reduction). These various modulation parameters 308 can be output to a combiner 310, which may then output a single modulation parameter or instruction to the modulator 312. In some examples, the combiner 310 can select the greatest modulation from among the modulation parameters 308 and provide that parameter to the modulator 312. For example, in the case of modulation parameters 308 of 0.1 dB, 2 dB, and 0 dB, the combiner 310 may output a gain reduction of 2 dB to the modulator 312, which may then modulate the gain accordingly. In some examples, the combiner 310 may combine the modulation parameters 308 in other ways, for example by weighting the various parameters 308, taking an average of the parameters 308, or other suitable amalgamation of the incoming modulation parameters 308 to output a particular instruction to the modulator 312.

In operation, the temperature sensors 302 obtain temperature data that can be used to determine whether the lower temperature threshold has been exceeded. To reduce the risk of any damage from increased temperatures, once the lower threshold has been exceeded, the thermal controller 304 can initiate modulation of playback device operation (e.g., by reducing gain by an amount dependent on the particular temperature parameters 306). If, following the modulation, the temperature falls below the lower temperature threshold, then the modulation (e.g., gain reduction) can cease, and the playback device can resume normal operation. If, instead, the temperature stays above the lower temperature threshold, then device operation can continue to be modulated via the thermal controller, with the degree of modulation (e.g., amount of gain reduction) depending on the new temperature data obtained via the sensors. For example, as the temperature continues to increase beyond the lower temperature threshold, the amount of gain reduction can be increasingly large. If the temperature continues to increase and further exceeds the upper temperature threshold (e.g., a maximum safe operating temperature of the playback device), audio playback or other device operation can be suspended and/or the device may be shut down completely.

Figure 4:
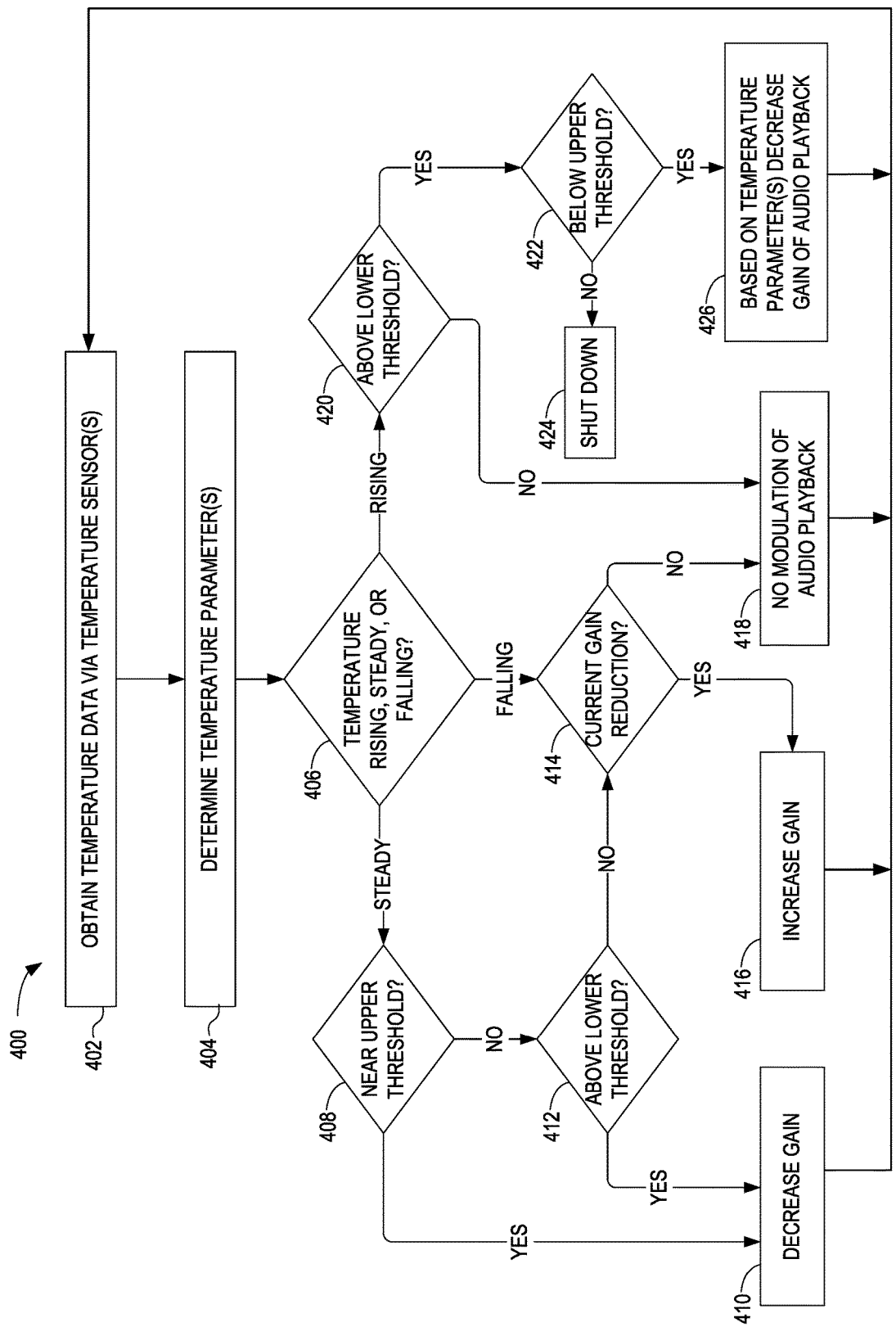
FIG. 4 is a flow diagram of a method for thermal control of a playback device.

FIG. 4 is a flow diagram of a process 400 for thermal control of a playback device. In some embodiments, the process 400 includes one or more instructions stored in memory (e.g., the memory 112b of FIG. 1) and executed by one or more processors (e.g., the processor 112a of FIG. 1) of a playback device (e.g., the playback device 110 of FIG. 1, the playback device 205 of FIG. 2). Although the blocks are shown in a particular order, in some embodiments the steps may be performed in different orders. Additionally or alternatively, certain blocks may be omitted, combined, or sub-divided into separate blocks.

In block 402, the temperature data is obtained via one or more temperature sensors. As noted previously, one or more temperature sensors can be disposed on, within, or about the playback device and configured to detect temperature. The temperature sensors can continuously provide temperature data at a sampling rate, for example one temperature reading every 5 seconds, seconds, 15 seconds, etc.

In block 404, temperature parameter(s) are determined based on the data obtained via the temperature sensor(s). As described previously, the temperature parameter can characterize both an absolute temperature based on the temperature data and a change in the temperature data over time. For example, the temperature parameter can indicate whether the temperature at any particular sensor is above, at, or below a lower temperature threshold (e.g., a temperature above which gain reduction or other modulation of playback device operation may be initiated), as well as whether the temperature is below, near, at, or above an upper temperature threshold (e.g., a maximum safe operating temperature, above which a playback device may be shut down to avoid permanent damage). Additionally, the temperature parameter can characterize a change in temperature over time, such as classifying the temperature at any given sensor as rising, falling, or remaining steady.

The process 400 continues to decision block 406 with determining whether the temperature is rising, steady, or falling. If the temperature is steady (e.g., the temperature has not changed over N samples or has changed by less than a threshold amount over N samples), the process 400 proceeds to decision block 408 to determine whether the temperature is near the upper threshold. If the temperature is near (e.g., within 0, 1, 2, 3, 4, or 5 degrees C.) the upper threshold, then the gain is reduced in block 410. This reflects a state in which, although the temperature is steady, it remains close to the upper threshold (e.g., the maximum safe operating temperature). Accordingly, it can be beneficial to incrementally reduce the gain of audio playback in an attempt to lower the temperature of the device further away from the upper threshold. The gain reduction in block 410 can be any suitable amount. In some examples, the gain reduction in block 410 is relatively small, for example, about 0.05, 0.1, 0.15, 0.2, or about 0.25 dB. Following this gain reduction in block 410, the process returns to block 402 with obtaining new temperature data via the temperature sensor(s).

Returning to decision block 408, if the steady temperature is not near the upper threshold, the process 400 continues with determining, in block 412, whether the temperature is above the lower threshold (e.g., the temperature above which gain modulation may be initiated). If the temperature is above the threshold, then the process 400 continues to block 410 with decreasing gain of audio playback. In this manner, steady state temperature that is above the lower threshold can continue to be lowered by decreasing the gain of audio playback.

If, in block 412, the temperature is not above the lower threshold, the process 400 continues to block 414 to determine whether current gain reduction is applied. For example, if a prior iteration of the process 400 has resulted in gain reduction, then the process 400 would proceed to block 416 with increasing the gain. In this scenario, the gain has been previously reduced (e.g., a gain value less than unity) because of excessive temperature. However, as the temperature is now a steady state (block 406) and is below both the upper threshold (block 408) and the lower threshold (block 412), the gain can be increased. In some examples, the gain can be increased by an incremental amount (e.g., 0.1 dB) or may be increased to unity (e.g., restored to a pre-modulation level). Following the gain increase in block 418, the process 400 returns to block 402 with obtaining new temperature data via the temperature sensor(s).

If, in block 414, if there is no current gain reduction applied, the process 400 continues to block 418 with no modulation of audio playback. This scenario reflects a playback device with a steady-state temperature and no gain reduction applied. As such, the thermal controller need not alter operation of the playback device and audio playback can proceed as normal.

Returning to block 406, if the temperature is found to be falling, the process 400 continues to block 414 with determining whether current gain reduction is applied. If so, the process 400 continues to block 416 to increase gain. If no current gain reduction is applied (block 414), the process continues in block 418 with no modulation of audio playback. This flow reflects a scenario in which temperature is falling and accordingly risk of thermal damage to the playback device is low. As such, audio playback either proceeds without any modulation (block 418), or any prior-effected gain reduction is at least partially removed or counteracted via a gain increase in block 416.

If, in block 406, the temperature is rising, the process 400 continues to block 420 with determining whether the temperature is above the lower threshold (e.g., the temperature above which gain reduction may be initiated). If the temperature is not above this threshold, then the process 400 continues to block 418 with no modulation of audio playback. This reflects the scenario in which the temperature, although rising, is below the lower threshold and as such considered safe for normal operation of the playback device.

If the temperature is above the lower threshold in block 420, the process 400 continues to block 422 with determining whether the temperature is below the upper threshold (e.g., the maximum safe operating temperature of the playback device). If the temperature is at or above this threshold, the process 400 terminates in block 424 with shutting down operation of the playback device. This reflects a failsafe scenario in which, to avoid permanent damage to the playback device, the device is partially or completely shut down in response to the upper temperature threshold being met or exceeded.

If the temperature is below the upper threshold in block 422, then the process 400 continues to block 426 with decreasing gain of audio playback based on the temperature parameter (block 404). As noted previously, the temperature parameter can include a rate or other indicia of the change of temperature. In some examples, the temperature parameter includes a time elapsed since the last detected increase in temperature of at least a predetermined amount. As this time decreases (reflecting a faster increase in temperature), the amount of gain reduction can be increased in block 426.

For example, a function, lookup table, or other approach can be used to define particular gain reductions in terms of the time elapsed since the last temperature change of a pre-determined amount. For instance, a lookup table as shown in Table 1 below can be used to determine the gain reduction (in dB) applied to audio playback.

TABLE 1

| Time since last rise of 1° C. (seconds) | Gain Adjustment (dB) |
| --- | --- |
| 500+ | −0.1 |
| 200 | −0.5 |
| 80 | −1 |
| 60 | −2 |
| 3 | −4 |
| <3 | −8 |

This table illustrates one example of increasing gain adjustment with an increase in the detected rate of rising temperature. In various examples, the particular amount of gain reduction in response to various magnitudes of temperature rise can vary to achieve the desired thermal feedback loop. Following gain reduction applied in block 426, the process 400 returns to block 402 with obtaining new temperature data via the temperature sensor(s).

The iterative process 400 can continue to repeat (absent playback device shutdown as in block 424), thereby maintaining the playback device within safe operating conditions by incrementally reducing the gain of audio playback in response to rising temperature levels (block 426) or persisting elevated temperature levels (block 410), while restoring the gain to pre-reduction levels once temperatures are either steady or falling (block 416).

Figure 5:
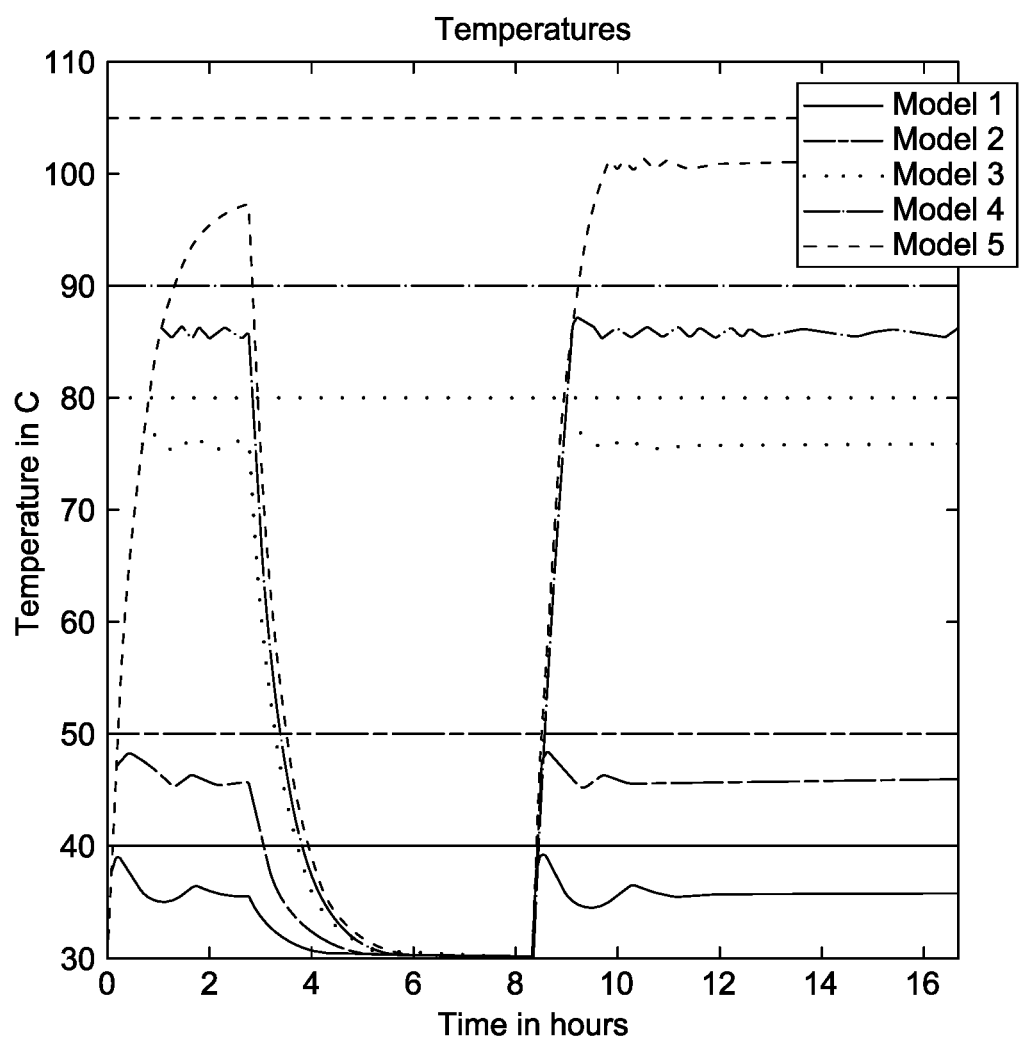
FIG. 5 is a graph showing temperature over time during thermal control processes in accordance with examples of the present technology.
Figure 6:
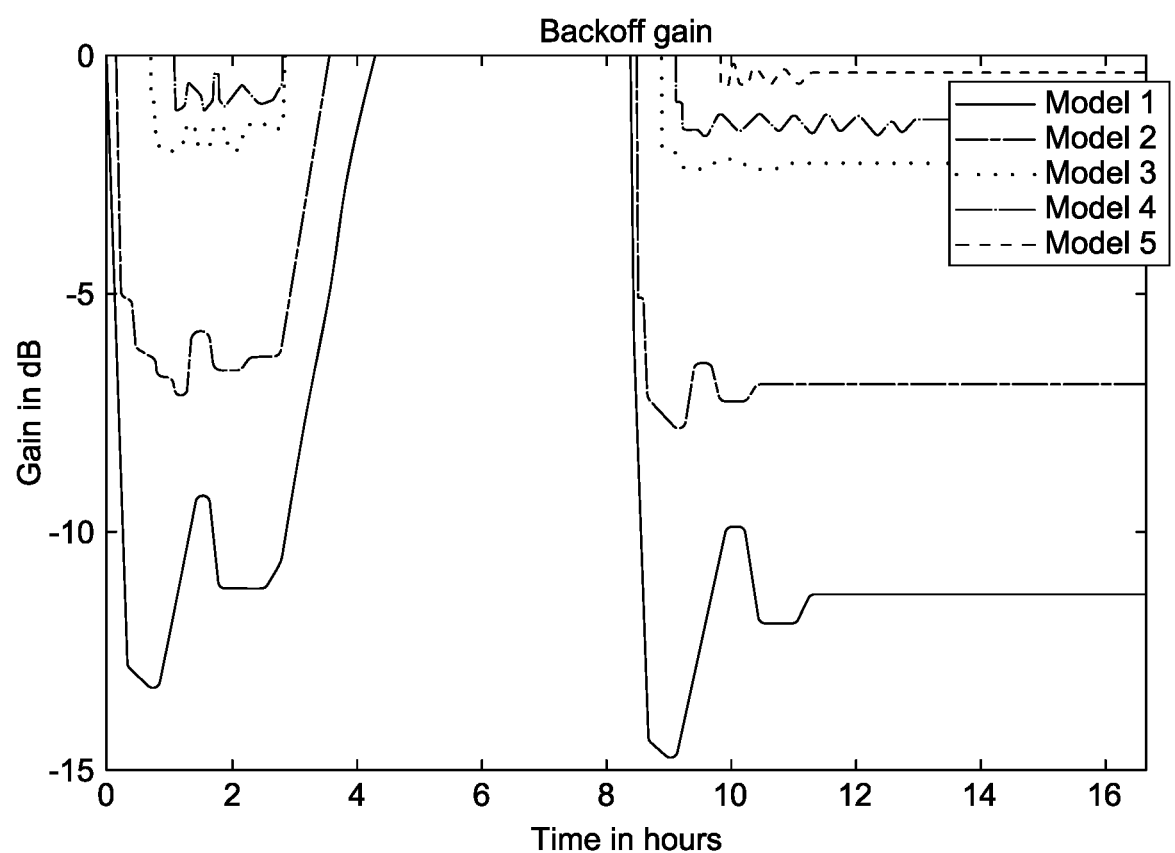
FIG. 6 is a graph showing gain reduction over time during thermal control processes in accordance with examples of the present technology.

FIGS. 5 and 6 illustrate exemplary data from modeling certain examples of the thermal controllers disclosed herein. FIG. 5 is a graph showing gain reduction over time during thermal control processes and FIG. 6 is a graph showing temperature over time during the same processes. To generate these graphs, a SONOS PLAY:5 playback device was modeled with an idle temperature of 30 degrees C. that was subjected to two thermal events: first an increase to a final temperature of 98 degrees C. (beginning at t=0 hours) and second an increase to a final temperature of 108 degrees C. (beginning at approximately t=8.25 hours). For each event, five different thermal controllers were modeled as Models 1-5, with respective upper temperature thresholds of 40, 50, 80, 90, and 105 degrees C., and respective lower temperature thresholds of 37, 47, 77, 87, and 102 degrees C.

As shown in FIG. 5, starting at t=0, the first thermal increase event begins and the temperature rises across all 5 models. As the temperature exceeds the lower temperature threshold (and approaches the upper temperature threshold) for each model, gain reduction is initiated (as reflected in FIG. 6) to maintain the device temperature within an operating range below the corresponding upper temperature threshold. Because Model 1 has the lowest upper temperature threshold (40 degrees C.), the gain reduction applied via Model 1 is greatest, with decreasing gain reductions applied for each subsequent model as the respective temperature thresholds increase. The maximum temperature of the first thermal event (98 degrees C.) is less than the lower temperature threshold of Model 5; as such, the thermal controller of Model 5 applies no gain reduction during the first thermal event. As the temperature event ceases (at approximately t=2.75 hours), the temperature exponentially decays, and the corresponding gain reductions applied via each model likewise are gradually reduced until returning to 0.

Similarly, in response to the second thermal event (beginning at approximately t=8.25 hours), each of the thermal controllers shown as Models 1-5 initiates gain reduction as the respective lower thresholds are exceeded. In this instance, the maximum temperature (108 degrees C.) exceeds the lower threshold of all models, including Model 5, and as such all models apply gain reduction to audio playback to maintain the device temperature below their respective upper threshold levels. As seen in FIGS. 5 and 6, in various examples, a thermal controller can be selected and configured to maintain a playback device safely within desired operating temperatures by gradually and incrementally applying gain reduction to audio playback until the temperature decreases sufficiently to restore normal device operation.

IV. Conclusion

The above discussions relating to playback devices, controller devices, playback zone configurations, and media content sources provide only some examples of operating environments within which functions and methods described below may be implemented. Other operating environments and/or configurations of media playback systems, playback devices, and network devices not explicitly described herein may also be applicable and suitable for implementation of the functions and methods.

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software examples or components can be embodied exclusively in hardware, exclusively in software, exclusively in firmware, or in any combination of hardware, software, and/or firmware. Accordingly, the examples provided are not the only ways) to implement such systems, methods, apparatus, and/or articles of manufacture.

Additionally, references herein to "example" means that a particular feature, structure, or characteristic described in connection with the example can be included in at least one example of an invention. The appearances of this phrase in various places in the specification are not necessarily all referring to the same example or example, nor are separate or alternative examples or examples mutually exclusive of other examples or examples. As such, the examples described herein, explicitly and implicitly understood by one skilled in the art, can be combined with other examples.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain examples of the present disclosure can be practiced without certain, specific details. In other instances, well known methods, procedures, components, and circuitry have not been described in detail to avoid unnecessarily obscuring examples of the examples. Accordingly, the scope of the present disclosure is defined by the appended claims rather than the foregoing description of examples.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

The disclosed technology is illustrated, for example, according to various Clauses described below. Various examples of examples of the disclosed technology are described as numbered Clauses (1, 2, 3, etc.) for convenience. These are provided as examples and do not limit the disclosed technology. It is noted that any of the dependent Clauses may be combined in any combination, and placed into a respective independent Clauses. The other Clauses can be presented in a similar manner.

Clause 1. A method of thermal control of a playback device, the method comprising: obtaining, via one or more temperature sensors carried by the playback device, temperature data; based on the temperature data, detecting a first temperature parameter indicating a first increase in temperature; in response to detecting the first temperature parameter, decreasing a gain of audio playback by a first amount; after decreasing the gain of audio playback by the first amount, detecting a second temperature parameter indicating a second increase in temperature; in response to detecting the second temperature parameter, further decreasing a gain of audio playback by a second amount different than the first amount.

Clause 2. The method of any one of the Clauses herein, wherein detecting the first temperature parameter comprises determining a rate of temperature increase.

Clause 3. The method of any one of the Clauses herein, wherein detecting the first temperature parameter comprises determining a time since a last detected temperature increase of at least a predetermined amount.

Clause 4. The method of any one of the Clauses herein, wherein an amount of gain reduction applied via decreasing the gain of audio playback by the first amount is based at least in part on the determined time.

Clause 5. The method of any one of the Clauses herein, further comprising determining that the temperature data has fallen below a predetermined temperature threshold and, based at least in part on the determination, increasing a gain of audio playback.

Clause 6. The method of any one of the Clauses herein, wherein the playback device is a first playback device bonded with a second playback device for synchronous playback, the method further comprising decreasing a gain of audio playback via the second playback device concurrently with decreasing the gain of audio playback via the first playback device by the first amount.

Clause 7. The method of any one of the Clauses herein, further comprising: obtaining temperature data from each of a plurality of temperature sensors carried by the playback device; for each temperature sensor, detecting a temperature parameter; for each temperature sensor, determining an amount of gain reduction to be applied to audio playback based on the detected temperature parameter; decreasing a gain of audio playback by the first amount, wherein the first amount comprises the largest gain reduction from among the gain reductions determined for each of the temperature sensors.

Clause 8. The method of any one of the Clauses herein, wherein obtaining temperature data comprises obtaining temperature data from one or more virtual sensors.

Clause 9. A playback device comprising: one or more temperature sensors; at least one audio transducer; one or more processors; and a computer-readable memory storing instructions that, when executed by the one or more processors, cause the playback device to perform operations comprising: the method of any one of the Clauses herein.

Clause 10. Tangible, non-transitory computer-readable medium storing instructions that, when executed by the one or more processors of a playback device, cause the playback device to perform operations comprising: the method of any one of the Clauses herein.

The invention claimed is:

1. A playback device comprising:
a plurality of temperature sensors;
at least one audio transducer;
one or more processors; and
data storage having instructions thereon that, when executed by the one or more processors, cause the playback device to perform operations comprising:
obtaining sensor data from each of the plurality temperature sensors, the sensor data indicating an increase in temperature;
for each temperature sensor, determining an amount of gain reduction to be applied to audio playback based at least in part on the sensor data; and
decreasing a gain of audio playback by a first amount, wherein the first amount comprises the largest gain reduction from among the gain reductions determined for each of the temperature sensors.

2. The playback device of claim 1, wherein the playback device is a first playback device bonded with a second playback device for synchronous playback, the operations further comprising decreasing a gain of audio playback via the second playback device concurrently with decreasing the gain of audio playback via the first playback device by the first amount.

3. The playback device of claim 1, wherein the operations further comprise, after decreasing the gain, determining that the sensor data indicates temperature has fallen below a predetermined temperature threshold and, based at least in part on the determination, increasing a gain of audio playback.

4. The playback device of claim 1, wherein the operations further comprise, after decreasing the gain, determining that the sensor data indicates temperature is falling and, based at least in part on the determination, increasing the gain of audio playback.

5. The playback device of claim 1, wherein the operations further comprise, after decreasing the gain, determining that the sensor data indicates temperature has risen above a predetermined threshold and, based at least in part on the determination, shutting down the playback device.

6. The playback device of claim 1, wherein the operations further comprise, after decreasing the gain, determining that the sensor data indicates temperature is steady near an upper threshold and, based at least in part on the determination, further decreasing the gain of audio playback.

7. The playback device of claim 1, wherein the operations further comprise determining a time since a last detected temperature increase of at least a predetermined amount, and determining the amount of gain reduction to be applied to audio playback based at least in part on the determined time.

8. A method of thermal control of a playback device, the method comprising:
obtaining sensor data from each of a plurality of temperature sensors carried by the playback device, the sensor data indicating an increase in temperature;
for each temperature sensor, determining an amount of gain reduction to be applied to audio playback based at least in part on the sensor data; and
decreasing a gain of audio playback by a first amount, wherein the first amount comprises the largest gain reduction from among the gain reductions determined for each of the temperature sensors.

9. The method of claim 8, wherein the playback device is a first playback device bonded with a second playback device for synchronous playback, the method further comprising decreasing a gain of audio playback via the second playback device concurrently with decreasing the gain of audio playback via the first playback device by the first amount.

10. The method of claim 8, further comprising, after decreasing the gain, determining that the sensor data indicates temperature has fallen below a predetermined temperature threshold and, based at least in part on the determination, increasing a gain of audio playback.

11. The method of claim 8, further comprising, after decreasing the gain, determining that the sensor data indicates temperature is falling and, based at least in part on the determination, increasing the gain of audio playback.

12. The method of claim 8, further comprising, after decreasing the gain, determining that the sensor data indicates temperature has risen above a predetermined threshold and, based at least in part on the determination, shutting down the playback device.

13. The method of claim 8, further comprising, after decreasing the gain, determining that the sensor data indicates temperature is steady near an upper threshold and, based at least in part on the determination, further decreasing the gain of audio playback.

14. The method of claim 8, further comprising determining a time since a last detected temperature increase of at least a predetermined amount, and determining the amount of gain reduction to be applied to audio playback based at least in part on the determined time.

15. One or more tangible, non-transitory computer-readable media storing instructions that, when executed by one or more processors of a playback device, cause the playback device to perform operations comprising:
obtaining sensor data from each of a plurality of temperature sensors carried by the playback device, the sensor data indicating an increase in temperature;
for each temperature sensor, determining an amount of gain reduction to be applied to audio playback based at least in part on the sensor data; and
decreasing a gain of audio playback by a first amount, wherein the first amount comprises the largest gain reduction from among the gain reductions determined for each of the temperature sensors.

16. The one or more computer-readable media of claim 15, wherein the playback device is a first playback device bonded with a second playback device for synchronous playback, the operations further comprising decreasing a gain of audio playback via the second playback device concurrently with decreasing the gain of audio playback via the first playback device by the first amount.

17. The one or more computer-readable media of claim 15, wherein the operations further comprise, after decreasing the gain, determining that the sensor data indicates temperature has fallen below a predetermined temperature threshold and, based at least in part on the determination, increasing a gain of audio playback.

18. The one or more computer-readable media of claim 15, wherein the operations further comprise, after decreasing the gain, determining that the sensor data indicates temperature is falling and, based at least in part on the determination, increasing the gain of audio playback.

19. The one or more computer-readable media of claim 15, wherein the operations further comprise, after decreasing the gain, determining that the sensor data indicates temperature has risen above a predetermined threshold and, based at least in part on the determination, shutting down the playback device.

20. The one or more computer-readable media of claim 15, wherein the operations further comprise, after decreasing the gain, determining that the sensor data indicates temperature is steady near an upper threshold and, based at least in part on the determination, further decreasing the gain of audio playback.

* * * * *